(12) United States Patent
Di Vincenzo et al.

(10) Patent No.: US 11,289,146 B2
(45) Date of Patent: Mar. 29, 2022

(54) WORD LINE TIMING MANAGEMENT

(71) Applicant: Micron Technology, Inc., Boise, ID (US)

(72) Inventors: Umberto Di Vincenzo, Capriate San Gervasio (IT); Ferdinando Bedeschi, Biassono (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/552,984

(22) Filed: Aug. 27, 2019

(65) Prior Publication Data
US 2021/0065763 A1 Mar. 4, 2021

(51) Int. Cl.
G11C 11/22 (2006.01)
(52) U.S. Cl.
CPC ........ G11C 11/2257 (2013.01); G11C 11/221 (2013.01); G11C 11/2255 (2013.01); G11C 11/2259 (2013.01); G11C 11/2293 (2013.01)
(58) Field of Classification Search
CPC ............ G11C 11/2257; G11C 11/2259; G11C 11/2293; G11C 11/221; G11C 11/2255; G11C 27/026; G11C 11/2273; G11C 11/2275
USPC ........................................................ 356/145
See application file for complete search history.

(56) References Cited

U.S. PATENT DOCUMENTS

| | | | |
|---|---|---|---|
| 6,741,490 B2 | 5/2004 | Baker | |
| 7,106,635 B1* | 9/2006 | Mandal | G11C 7/12 365/189.11 |
| 10,163,481 B1* | 12/2018 | Vimercati | G11C 11/221 |
| 10,762,961 B2* | 9/2020 | Bertin | H03K 19/17736 |
| 2003/0053326 A1* | 3/2003 | Murakuki | G11C 11/22 365/145 |
| 2003/0123294 A1 | 7/2003 | Kim et al. | |
| 2004/0257855 A1 | 12/2004 | Hilton | |
| 2009/0219757 A1 | 9/2009 | Furuta et al. | |
| 2010/0128513 A1* | 5/2010 | Nishimura | G11C 11/22 365/145 |
| 2014/0198559 A1 | 7/2014 | Pemer | |

(Continued)

OTHER PUBLICATIONS https://web.stanford.edu/class/archive/engr/engr40m.1178/slides_sp17/lecture02.pdf; all pages (Year: 2017).*

(Continued)

*Primary Examiner* — Fernando Hidalgo
(74) *Attorney, Agent, or Firm* — Holland & Hart LLP

(57) ABSTRACT

Methods, systems, and devices for word line timing management are described. In some examples, a digit line may be precharged as part of accessing a memory cell. The memory cell may include a storage component and a selection component. A word line may be coupled with the selection component, and the word line may be selected in order to couple the storage component with the digit line, by way of the selection component. The word line may be selected while the digit line is still being precharged, and the storage component may become coupled with the digit line with reduced delay after the end of precharging of the digit line, concurrent with the end of the precharging of the digit line, or while the digit line is still being charged. Related techniques for sensing a logic state stored by the memory cell are also described.

25 Claims, 9 Drawing Sheets

(56) References Cited

U.S. PATENT DOCUMENTS

| | | | |
|---|---|---|---|
| 2016/0111138 A1* | 4/2016 | Izumi | G11C 11/221 |
| | | | 365/65 |
| 2017/0287541 A1 | 10/2017 | Vimercati | |
| 2017/0372765 A1* | 12/2017 | Kawamura | G11C 11/2273 |
| 2019/0088320 A1* | 3/2019 | Tandingan | G11C 11/2259 |
| 2019/0147959 A1* | 5/2019 | Hsu | G11C 16/0483 |
| | | | 365/185.12 |
| 2019/0164579 A1* | 5/2019 | Glazewski | H03F 3/16 |
| 2020/0020367 A1* | 1/2020 | Hasbun | G11C 7/1078 |
| 2020/0075609 A1* | 3/2020 | Morris | G11C 11/2273 |

OTHER PUBLICATIONS

U.S. Appl. No. 15/846,373, entitled "Charge Separation for Memory Sensing," filed Dec. 19, 2017 (37 pages).

\* cited by examiner

WORD LINE TIMING MANAGEMENT

BACKGROUND

The following relates generally to a system that includes at least one memory device and more specifically to word line timing management.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

Improving memory devices, generally, may include increasing memory cell density, increasing read/write speeds, increasing reliability, increasing data retention, reducing power consumption, decreasing stress on a memory cell, or reducing manufacturing costs, among other metrics.

DETAILED DESCRIPTION

Figure 1:
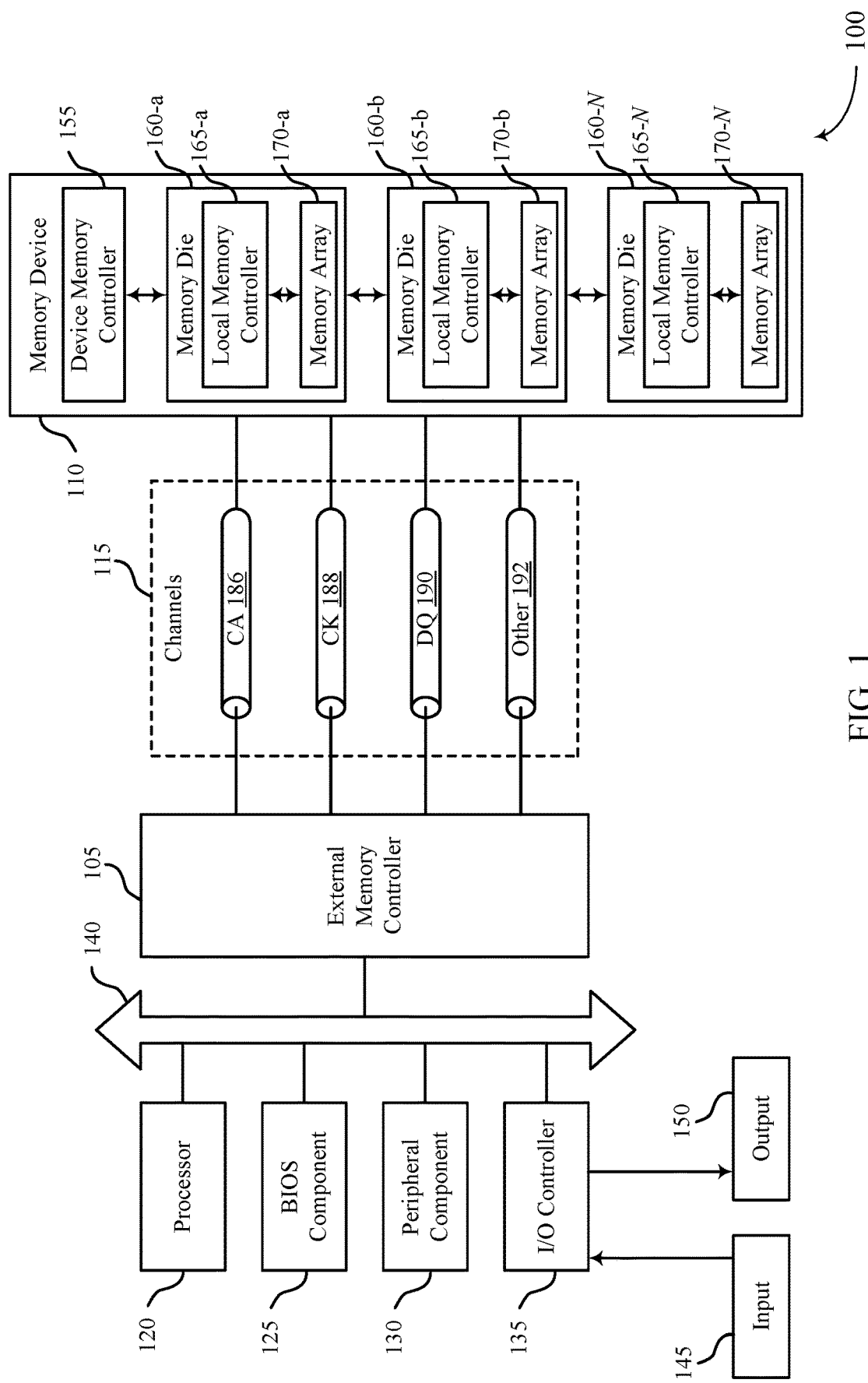
FIG. 1 illustrates an example of a system that supports word line timing management in accordance with examples as disclosed herein.

A memory cell may be accessed, and a logic state of the memory cell may be sensed, in accordance with aspects of the present disclosure. The access may occur as part of a read operation, a write operation, or a combination thereof.

In some memory architectures, a memory cell (e.g., a ferroelectric memory cell) may be coupled with a plate, a word line, and a digit line. The memory cell may include a storage component (e.g., a ferroelectric capacitor) and a selection component (e.g., a transistor, such as a thin-film transistor (TFT)). The digit line and the word line may be coupled with the selection component, and activating the word line may serve to couple the storage component with the digit line. The memory cells may be arranged into columns and rows where each row of memory cells corresponds to (e.g., is coupled with) a same word line, and each column of memory cells corresponds to (e.g., is coupled with) a same digit line. In some cases, a single plate may be common to (e.g., shared by, coupled with) multiple memory cells. Such an architecture may, for example, reduce the complexity of control schemes and related circuitry (e.g., decoder circuitry) compared to each memory cell having a unique, separately controlled plate.

In some memory architectures, accessing a memory cell during a read or write operation may include applying a non-zero voltage across the memory cell in order to read (e.g., sense) a logic state stored by the memory cell. Accessing the memory cell may also include selecting a digit line and a word line coupled with the memory cell by applying respective voltages to the digit line and the word line. In some examples, a voltage may be applied to the selected digit line in order to raise the voltage of the digit line to a target value and/or charge any parasitic capacitances associated with digit line. This may be referred to as precharging the digit line, and may be performed by coupling the digit line with a voltage supply (e.g., a voltage source), which may be referred to as a precharge voltage supply.

In some sensing schemes, once the digit line has been precharged (e.g., the voltage of the digit line has reached the target value), the precharge voltage supply may be decoupled from the digit line, and then a voltage may be applied to the word line such that the selection component (e.g., transistor) will later begin conducting (e.g., subsequently becomes conductive) and couple the storage element with the digit line.

In some cases, the precharge voltage supply may be included in, coupled with (e.g., selectively coupled and decoupled with), or otherwise associated with a sense amplifier. For example, the precharge voltage supply may provide a supply voltage or a reference voltage for the sense amplifier. In some such cases, the precharge voltage supply may be coupled with the digit line by coupling the digit line to the sense amplifier while the sense amplifier is coupled with the precharge voltage supply, and the precharge voltage supply may be decoupled from the digit line by decoupling the precharge voltage supply from the sense amplifier (e.g., while maintaining the sense amplifier as coupled with the digit line).

Regardless of the relationship between the precharge voltage supply and the sense amplifier, the digit line may be coupled with the sense amplifier before, at the beginning of, or at some other time during the sense operation. The sense amplifier, in some instances, may include an amplification capacitor (e.g., AMPCAP), which may integrate or otherwise take account of (support a determination of a logic state based on) an amount of charge shared between the AMPCAP and the memory cell (e.g., received from or provided to the ferroelectric capacitor by the AMPCAP) during the sense operation (e.g., once the selection component begins conducting). For example, the logic state of the memory cell may be determined based on the amount of charge shared between the AMCAP and the ferroelectric capacitor within the memory cell (e.g., the amount of charge provided to or by the AMPCAP) during the sense operation.

As described herein, it may be advantageous to apply the selection voltage to the word line (e.g., to select (activate) the word line) while the digit line is still being precharged (e.g., while the precharge voltage supply is coupled with the digit line, before the precharge voltage supply is decoupled from the digit line). For example, the selection component may exhibit some lag from the time the word line voltage first begins increasing (e.g., the time the word line is selected) to the time the selection component becomes conductive (e.g., due to a threshold voltage of the selection component, a turn on time of the selection component, or the like). Thus, activating the word line at a time prior to decoupling the precharge voltage supply from the digit line may result in the selection component becoming conductive with a reduced delay after (or in some cases, even at or before) the time that the precharge voltage supply is decoupled from the digit line. Such techniques as described herein may better-align the end of the digit line precharge and the start of the selection component conduction, may reduce the overall duration of a read operation, and may provide other benefits as may be appreciated by one of ordinary skill in the art.

In some cases, the time at which the selection voltage is applied to the word line may be adjusted to a time sufficiently early that the selection component begins conducting—and thus the ferroelectric capacitor is coupled with the digit line—before the precharge voltage supply is decoupled from the digit line. This may result in the ferroelectric capacitor charge sharing with the voltage supply before the end of the precharge operation. This may not, however, hinder an ability to sense the logic state stored by ferroelectric memory cell—rather, it may provide one or more related benefits as discussed herein or as otherwise may be appreciated by one of ordinary skill the art.

For example, as discussed herein, a ferroelectric capacitor may store two types of charge—a displacement charge and a dipole charge. The displacement charge may be associated with charge stored based on a voltage differential across the capacitor, and the dipole charge may be associated with a polarization of the ferroelectric material within the ferroelectric capacitor. The displacement charge and the dipole charge may be considered separate charges, or may be considered components of a single charge, but the teachings herein are not dependent on the underlying theory or mechanism. The dipole charge stored by ferroelectric capacitor the may be slower to change (e.g., increase or decrease, change polarization) than the displacement charge. Thus, if the ferroelectric capacitor is coupled with the digit line before the precharge voltage supply is decoupled from the digit line, charge sharing related to the displacement charge (and some portion of the dipole charge) may occur between the ferroelectric capacitor and the precharge voltage supply, but at least some dipole charge may still be shared between the ferroelectric capacitor and the AMPCAP after the precharge voltage supply is decoupled from the digit line.

Thus, a logic state stored by ferroelectric capacitor may be sensed based on an amount of charge shared with the AMPCAP, regardless of whether or not some charge sharing occurs between the ferroelectric capacitor and the precharge voltage supply during the sense operation. For example, if relatively less charge is shared between the AMPCAP and the ferroelectric memory during the sense the operation, then the memory cell may be determined as having stored a first logic state (e.g., a logic "1"); if relatively more charge is shared between the AMPCAP and the ferroelectric memory during the sense the operation, then the memory cell may be determined as having stored a second logic state (e.g., a logic "0"). Further, if charge sharing associated with the displacement charge of the ferroelectric capacitor occurs between the ferroelectric capacitor and the voltage supply, then zero or very little charge may be shared between the ferroelectric capacitor and the AMCAP in the case of the first logic state, and a greater amount of charge (e.g., an amount equal to all or most of the dipole charge) may be shared between the ferroelectric capacitor and the AMCAP in the case of the second logic state—such a sensing scheme may beneficially improve the reliability and sensitivity of the sensing operation (e.g., by increasing the ratio of shared charge amounts between the two logic states, from the AMPCAP perspective), while also beneficially supporting the use of a smaller (lower capacitance, and thus potentially physically smaller) AMPCAP.

Features of the disclosure are initially described in the context of a memory system and memory die as described with reference to FIGS. 1-3. Features of the disclosure are described in the context of a memory array and timing diagram as described with reference to FIGS. 4 and 5. These and other features of the disclosure are further illustrated by and described with reference to an apparatus diagram and flowcharts that relate to word line timing management as described with references to FIGS. 6-9.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include portions of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or any combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. In some examples, a memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. For example, the commands may include activation commands, which may cause a word line to be selected as described herein. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be any combination of these types of components. In such cases, the processor 120 may be an example of a central processing unit (CPU), a graphics processing unit (GPU), a general purpose graphic processing unit (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110.

The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In some examples, the channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel. In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be ×4 (e.g., including four signal paths), ×8 (e.g., including eight signal paths), ×16 (including sixteen signal paths), and so forth. Signals communicated over the channels may use a double data rate (DDR) timing scheme. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

In some cases, the other channels 192 may include one or more error detection code (EDC) channels. The EDC channels may be configured to communicate error detection signals, such as checksums, to improve system reliability. An EDC channel may include any quantity of signal paths.

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM3, PAM4, PAM8, etc., quadrature amplitude modulation (QAM), quadrature phase shift keying (QPSK), and/or others. A multi-symbol signal (e.g., PAM3 signal or PAM4 signal) may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

In some examples, the memory device 110 may support an access operation as described herein (e.g., in response to an activation command, an access command, or one or more other commands, alone or in any combination). The access operation may relate to a memory cell that is coupled with a digit line and a word line (e.g., for which the digit line and word line are coupled with a transistor or other selection component of the memory cell). In order to access (e.g., read from, write to) the memory cell, the digit line and the word line may each be selected. The word line may be selected during while the digit line is being precharged. For example, the word line may be selected such that the voltage of the word line begins increasing while the digit line is being precharged to a target voltage using a voltage supply (e.g., before the voltage supply used for precharge is decoupled from the digit line, before the digit line reaches the target voltage). This may better-align (e.g., avoid or reduce a delay between) the time at which the digit line reaches a target (precharge) voltage needed to access the memory cell and the time at which the selection component begins conducting. In some cases, the word line may be selected such that the digit line becomes coupled with the ferroelectric capacitor before the precharge voltage supply is decoupled from the digit line.

In some examples, a capacitor of the memory cell may charge share with the capacitor of the sense component (AMPCAP) in order to determine a logic state of the memory cell. Because the amount of charge stored to a capacitor of a memory cell may depend on its logic state, the logic state of the memory cell may be determined based on the amount of charge shared between the capacitor of the memory cell and the AMPCAP. In some cases, where word line is selected at a time such that the digit line becomes coupled with the ferroelectric capacitor before the precharge voltage supply is decoupled from the digit line, the precharge voltage supply may also charge share with the capacitor of the memory cell. Charge sharing between the precharge voltage supply and the memory cell may occur or cease prior to the AMPCAP charge sharing with the memory cell.

In some cases, if the memory cell stores a first logic state (e.g., a logic "1"), then the voltage supply may charge share with (e.g., provide charge to) the memory cell such that relatively less (e.g., zero) charge may be subsequently shared with (e.g., provided to) the memory cell by the AMPCAP—thus, relatively less charge being shared between the AMPCAP and the memory cell may be indicative of the first logic state. However, if the memory cell stores a second logic state (e.g., a logic "0"), then relatively more (e.g., a non-zero amount) charge may be subsequently shared with (e.g., provided to) the memory cell by the AMPCAP—thus, relatively more (e.g., some) charge being shared between the AMPCAP and the memory cell may be indicative of the second logic state.

In some cases, selecting the word line at a time as described herein may improve the reliability of the sensing operation by reducing the amount of charge shared by the AMPCAP when the memory cell is either logic state (e.g., eliminating the common mode charge), which may increase the ratio between (i) the amount of charge shared by the AMPCAP when the memory cell is in the first logic state (e.g., reduced to zero) and (ii) the amount of charge shared by the AMPCAP when the memory cell is in the second logic state. Further, reducing the amount of charge shared by the AMPCAP when the memory cell is in either logic state may reduce the size of the AMPCAP needed by a sense component.

Figure 2:
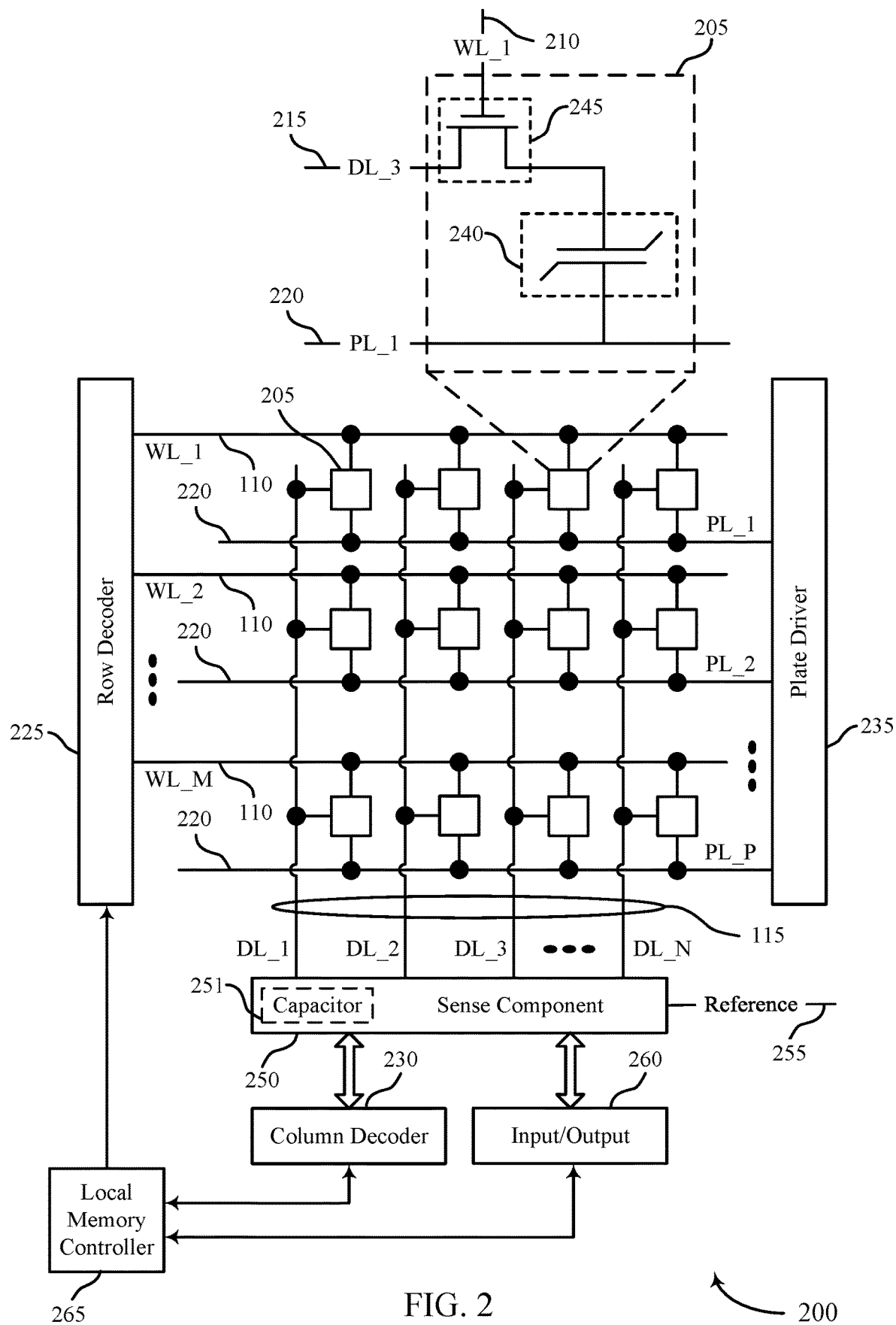
FIG. 2 illustrates an example of a memory die that supports word line timing management in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or an electronic memory apparatus. The memory die 200 may include one or more memory cells 205 that are programmable to store different logic states. Each memory cell 205 may be programmable to store two or more states. For example, the memory cell 205 may be configured to store one bit of information (e.g., a logic 0 or a logic 1). In some cases, a single memory cell 205 (e.g., a multi-level memory cell) may be configured to store more than one bit of information at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material (a ferroelectric capacitor) to store a charge (e.g., a displacement charge) and/or a polarization (e.g., a dipole charge) representative of the programmable state. In DRAM architectures, the memory cell 205 may include a capacitor that includes a dielectric material to store a charge (e.g., a displacement charge) representative of the programmable state. A displacement charge may be associated with a typical (linear) charge stored to a capacitor (ferroelectric or otherwise), whereas a dipole charge may be specific to the polarization properties of the ferroelectric material. The dipole charge stored by ferroelectric capacitor may change (e.g., increase or decrease, charge or discharge, change polarity) more slowly than the displacement charge. In some examples, a logic state of the memory cell 205 may be determined based on an amount of charge shared between a sensing capacitor (AMCAP) and the memory cell during a sensing operation.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. In some cases, a column decoder 230 may include a precharge voltage supply and be configured to selectively couple and decouple the precharge voltage supply from a selected digit line. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245 (selection component). The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

Selecting or deselecting the memory cell 205 may be accomplished by activating or deactivating the switching component 245. The capacitor 240 may be placed in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage (e.g., a selection voltage) being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to determine a state (e.g., a polarization state or other charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge.

During a read operation, the capacitor 240 of memory cell 205 may output a signal via (e.g., discharge to or receive a charge from) its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of the memory cell 205 may be provided as an output of the sense component 250 (e.g., to an input/output 260), and may indicate the detected logic state to another component of a memory device 110 that includes the memory die 200, such as a device memory controller 155 (e.g., directly or using the local memory controller 265). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some cases, one or more of the row decoder 225, column decoder 230, and plate driver 235, and sense component 250 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation (e.g., to a target voltage, using a circuit or other component that may be referred to as a precharge voltage supply).

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

In some cases, the local memory controller 265 may be configured to perform a read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some examples, the word line 210 may be selected while the digit line 215 is being precharged to a target voltage (e.g., while a voltage supply used for precharge is still coupled with the digit line 215). This may better-align (e.g., reduce a gap or delay between, such as to zero or some other reduced amount) the time at which the digit line reaches the target voltage and the time at which the switching component 245 couples the digit line with the capacitor 240.

In some cases, the word line 210 may be selected at a time such that the digit line 215 is still being precharged (e.g., a voltage supply used for precharge is still coupled with the digit line) even after the switching component 245 couples the digit line with the capacitor 240. This may cause the voltage supply to charge share with the capacitor 240 until the voltage supply is removed (e.g., decoupled from the digit line 215).

As discussed herein, a logic state of the memory cell 205 may be determined based on the charge (e.g., an amount of charge representative of a displacement charge and/or dipole charge) shared between a capacitor 251 (e.g., AMPCAP) included in the sense component 250 and the capacitor 240. Selecting the word line 210 in accordance with the teachings herein may improve the reliability of such sensing operation, while reducing the size of the capacitor 251 needed by the sense component 250.

In some cases, the time which the word line 210 is selected during an access operation may be configurable (e.g., trimmable). For example, the time at which the word line 210 is selected during an access operation may be configured based on one or more fuses or antifuses and an associated fuse load procedure, or may be configured based setting one or more mode registers within the memory device.

In some cases, the time at which the word line 210 is selected during an access operation may be configurable (adjustable, tunable, trimmable) on a per-device or per die 200 basis, and each word line 210 may within the device or die 200 may be configured to be selected according to a same timing (at a same time within the timeline of an access operation). For example, the time at which a word line 210 is selected during an access operation may be configured to optimize for process variations (e.g., variations in threshold voltage or turn-on time of switching components 245 across devices or dies 200), adjust performance, or for other reasons that may be appreciated by one of ordinary skill in the art.

Additionally or alternatively, the time at which the word line 210 is selected may be configurable (adjustable, tunable, trimmable) on a per word line 210 or per group of word lines 210 basis, such that different word lines 210 within the die 200 may be configured to be selected according to different timings (at different times within the timeline of an access operation). For example, the time at which a word line 210 is selected during an access operation may vary across word lines 210 based on a topology of the memory die 200 or related bases, which may include a length of the digit line 215, a length of the world line 210, a position of the memory cell 205 in the memory die 200, a distance between the memory cell and other components of the memory die 200 (e.g., the sense component 250, the precharge voltage supply, a word line driver (which may be included in or coupled with the row decoder 225), or any combination thereof.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3A:
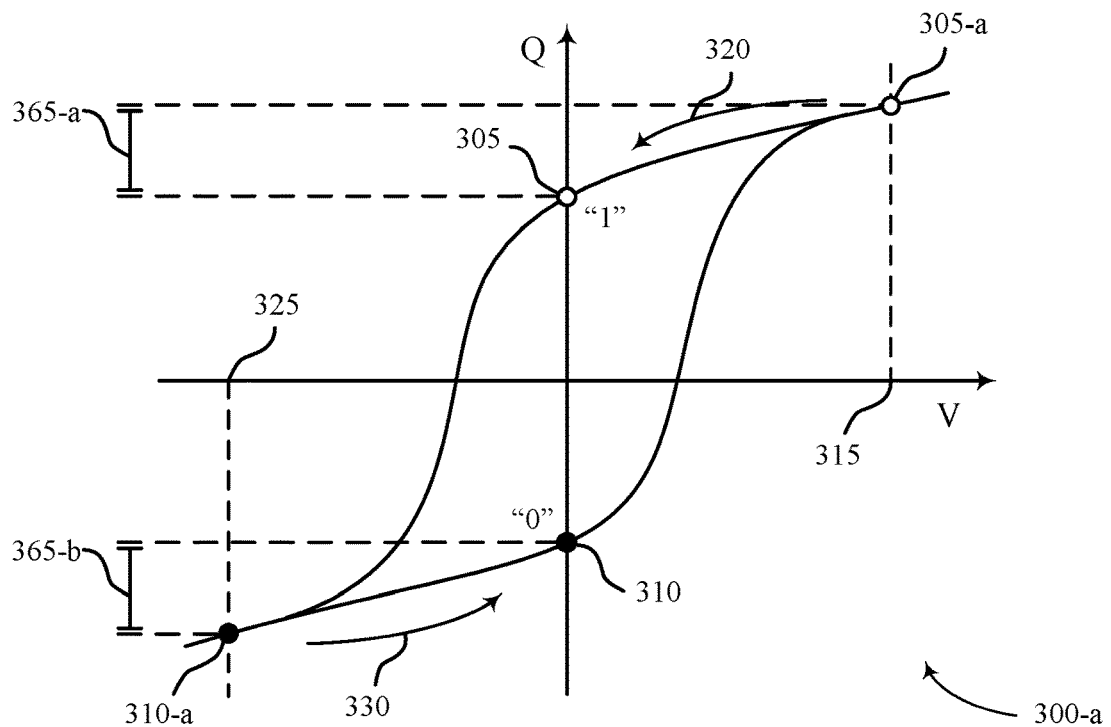
FIGS. 3A and 3B illustrate examples of hysteresis curves that support word line timing management in accordance with examples as disclosed herein.
Figure 3B:
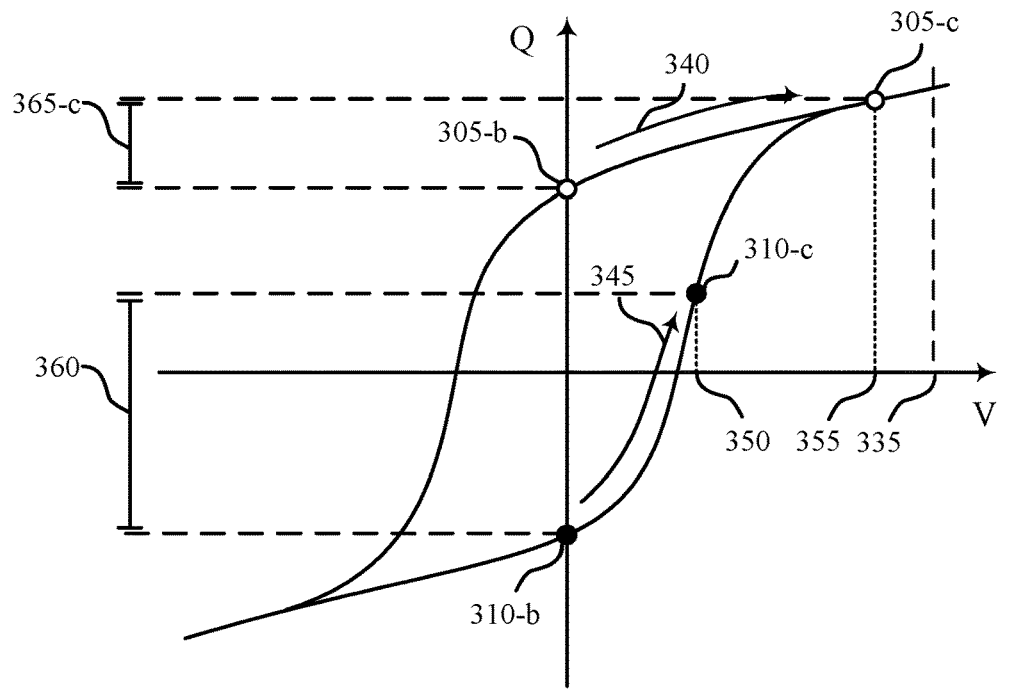

FIGS. 3A and 3B illustrate examples of non-linear electrical properties of a ferroelectric memory cell with hysteresis curves 300-*a* and 300-*b* in accordance with various examples as disclosed herein. Hysteresis curves 300-*a* and 300-*b* illustrate an example ferroelectric memory cell writing and reading process, respectively. Hysteresis curves 300-*a* and 300-*b* depict the charge, Q, stored on a ferroelectric capacitor (e.g., capacitor 240 described with reference to FIG. 2) as a function of a voltage difference, V.

A ferroelectric material is characterized by a spontaneous electric polarization, that is, it maintains a non-zero electric polarization in the absence of an electric field. Example ferroelectric materials include barium titanate (BaTiO3), lead titanate (PbTiO3), lead zirconium titanate (PZT), and strontium bismuth tantalate (SBT). The ferroelectric capacitors described herein may include these or other ferroelectric materials. Electric polarization within a ferroelectric capacitor results in a net charge at the ferroelectric material's surface and attracts opposite charge through the capacitor terminals, which may be referred to as a dipole charge or a polarization. Thus, charge is stored at the interface of the ferroelectric material and the capacitor terminals. Because the electric polarization may be maintained in the absence of an externally applied electric field for relatively long times, even indefinitely, charge leakage related to polarization (that is, dipole charge) may be significantly decreased (e.g., may occur at a much lower rate) as compared with, for example, displacement charge leakage, such as from linear capacitors (e.g., as employed in DRAM arrays). This may reduce the need to perform refresh operations.

Hysteresis curves 300-$a$ and 300-$b$ may be understood from the perspective of a single terminal of a capacitor. By way of example, if the ferroelectric material has a negative polarization, positive charge accumulates at the terminal. Likewise, if the ferroelectric material has a positive polarization, negative charge accumulates at the terminal. Additionally, the voltages in hysteresis curves 300-$a$ and 300-$b$ represent a voltage difference across the capacitor and are directional. For example, a positive voltage may be realized by applying a positive voltage to the terminal in question (e.g., a cell plate) and maintaining the second terminal (e.g., a cell bottom) at ground (or approximately zero volts (0V)). A negative voltage may be applied by maintaining the terminal in question at ground and applying a positive voltage to the second terminal—i.e., positive voltages may be applied to negatively polarize the terminal in question. Similarly, two positive voltages, two negative voltages, or any combination of positive and negative voltages may be applied to the appropriate capacitor terminals to generate the voltage difference shown in hysteresis curves 300-$a$ and 300-$b$.

As depicted in hysteresis curve 300-$a$, the ferroelectric material may maintain a positive or negative polarization with a zero-voltage difference, resulting in two possible charged states: a charge state 305 and a charge state 310. According to the examples of FIGS. 3A and 3B, charge state 305 represents a logic 1 and charge state 310 represents a logic 0. In some examples, the logic values of the respective charge states may be reversed to accommodate other schemes for operating a memory cell.

A logic 0 or 1 may be written to the memory cell by controlling the electric polarization of the ferroelectric material, and thus the charge on the capacitor terminals, by applying voltage. For example, applying a net positive voltage 315 across the capacitor results in charge accumulation until charge state 305-$a$ is reached. Upon removing voltage 315, charge state 305-$a$ follows path 320 until it reaches charge state 305 at zero voltage. Thus, the difference in charge (e.g., the charge difference 365-$a$ or the distance along the Q axis) between charge state 305-$a$ and charge state 305 may represent an amount of displacement charge, which may leak from the ferroelectric capacitor (e.g., relatively quickly) while the polarization (dipole charge) remains in an amount corresponding the magnitude of charge state 305 as measured along the Q axis.

Similarly, charge state 310 is written by applying a net negative voltage 325, which results in charge state 310-$a$. After removing negative voltage 325, charge state 310-$a$ follows path 330 until it reaches charge state 310 at zero voltage. Thus, the charge difference 365-$b$ (distance along the Q axis) between charge state 310-$a$ and charge state 310 may represent an amount of displacement charge, which may leak from the ferroelectric capacitor (e.g., relatively quickly) while the polarization (dipole charge) remains in an amount corresponding the magnitude of charge state 310 as measured along the Q axis.

Charge states 305 and 310 may also be referred to as the remnant polarization (Pr) values, i.e., the polarization (or dipole charge) that remains upon removing the external bias (e.g., voltage). The coercive voltage is the voltage at which the charge (or polarization) is zero.

To read, or sense, the stored state of the ferroelectric capacitor, a voltage may be applied across the capacitor. In response, the stored charge, Q, changes, and the degree of the change depends on the initial charge state—i.e., the final stored charge (Q) depends on whether charge state 305-$b$ or 310-$b$ was initially stored. For example, hysteresis curve 300-$b$ illustrates two possible stored charge states 305-$b$ and 310-$b$. Voltage 335 may be applied across the capacitor 240 as discussed with reference to FIG. 2. In other cases, a fixed voltage may be applied to the cell plate and, although depicted as a positive voltage, voltage 335 may be negative.

In response to voltage 335, if charge state 305-$b$ was initially stored, the amount of charged stored by the ferroelectric capacitor may follow path 340. Thus, the stored charge may change from charge state 305-$b$ to charge state 305-$c$, with the charge difference 365-$c$ (distance between charge state 305-$b$ and charge state 305-$c$ along the Q axis) representing the amount of charge shared with (e.g., acquired by) the ferroelectric capacitor. The charge difference 365-$c$ may be associated with a change in displacement charge of the ferroelectric capacitor. That is, the polarization of the ferroelectric capacitor may be unchanged (e.g., because both charge state 305-$b$ and 305-$c$ are positive Q values), and thus charge difference 365-$c$ may be independent of (not dependent on or impacted by, may not include) any remnant polarization of (dipole charge stored by) the ferroelectric capacitor prior to the application of the voltage 335. Accordingly, a logic state (e.g., a logic "1") associated with the charge state 305-$b$ may not be associated with a change in dipole charge, and the charge difference 365-$c$ may be based on (e.g., exclusively, may be equal in amount to) the displacement charge described as leaking in reference to charge states 305 and 305-$a$ of FIG. 3A.

In response to voltage 335, if charge state 310-$b$ was initially stored, then the amount of charged stored by the ferroelectric capacitor may follow path 345. Thus, the stored charge may change from charge state 310-$b$ to charge state 310-$c$, with the charge difference 360 (distance between charge state 310-$b$ and charge state 310-$c$ along the Q axis) representing the amount of charge shared (e.g., acquired by) the ferroelectric capacitor. The charge difference 360 may be associated with both a change in displacement charge and a change in dipole charge of the ferroelectric capacitor. That is, the polarization of the ferroelectric capacitor may change from negative to positive (e.g., because both charge state 310-$b$ is a negative Q value and charge state 310-$c$ is a positive Q value). Accordingly, a logic state (e.g., a logic "0") associated with the charge state 310-$b$ may be associated with a change in displacement charge and a change in dipole charge, where charge difference 360 may depend on (reflect, be based on, be indicative of) the remnant polarization of (dipole charge stored by) the ferroelectric capacitor prior to the application of the voltage 335 as well as the amount of displacement charge described as leaking in reference to charge states 310 and 310-$a$ of FIG. 3A.

The final position of charge state 305-$c$ and charge state 310-$c$, and thus the magnitudes of charge difference 365-$c$ and charge difference 360, may depend on one or more factors, including the specific sensing scheme and circuitry.

In some cases, the final charge may depend on the intrinsic capacitance of the digit line connected to the memory cell. For example, if the capacitor is electrically connected to the digit line and voltage 335 is applied, the voltage of the digit line may rise due to its intrinsic capacitance. A voltage measured at a sense component may not equal voltage 335, however, and may instead depend on the voltage of the digit line. The position of final charge states 305-c and 310-c on hysteresis curve 300-b may thus depend on the capacitance of the digit line and may be determined through a load-line analysis—i.e., charge states 305-c and 310-c may be defined with respect to the digit line capacitance. As a result, the voltage of the capacitor, voltage 350 or voltage 355, may be different and may depend on the initial state of the capacitor.

In some sensing schemes, by comparing the digit line voltage to a reference voltage, the initial state of the capacitor may be determined. The digit line voltage may be the difference between voltage 335 and the final voltage across the capacitor, voltage 350 or voltage 355—i.e., the difference between the voltage 335 and the voltage 350 or the difference between the voltage 335 and the voltage 355. A reference voltage may be generated such that its magnitude is between the two possible voltages of the two possible digit line voltages to determine the stored logic state—i.e., if the digit line voltage is higher or lower than the reference voltage. Upon comparison by the sense component, the sensed digit line voltage may be determined to be higher or lower than the reference voltage, and the stored logic value of the ferroelectric memory cell (i.e., a logic 0 or 1) may be determined.

In some cases, the logic state of the memory cell may be determined based on charge sharing between the ferroelectric capacitor and a capacitor included in a sense component (an AMPCAP). As discussed herein, a ferroelectric capacitor may store a dipole charge when in a resting (zero voltage) state, and may then exhibit a change in stored charge comprising a displacement charge amount or comprising a displacement charge amount and a dipole charge amount. In some examples, a logic state of the memory cell may be determined based on the change in the charge stored by the ferroelectric capacitor therein.

As discussed herein, a digit line may be coupled with a voltage supply to precharge the digit line to a target voltage. In some examples, the digit line may be coupled with the ferroelectric capacitor within the memory cell before the voltage supply is decoupled from the digit line, and an amount of charge may be shared between the voltage supply and the ferroelectric capacitor—this amount of charge may account for or otherwise reflect a change in the displacement charge of the memory cell, which may change more rapidly than the dipole charge. For example, when moving from charge state 305-b to charge state 305-c, the charge difference 360 may be provided (e.g., entirely) by the voltage supply. Additionally or alternatively, when moving from charge state 310-b to charge state 310-c, a first portion of the charge difference 360 may be provided by the voltage supply and a second portion of the charge difference 360 may be provided by the AMPCAP (e.g., based on the second portion of the charge being transferred from the AMPCAP to the memory cell). The first portion may include a change in the displacement charge of the memory cell and a (relatively small) change in the dipole charge of the memory cell, but may primarily reflect the change in the displacement charge to the slower-changing nature of the dipole charge. The second portion thus may account for or otherwise reflect (e.g., primarily or exclusively) a further change in the dipole charge of the memory cell.

Accordingly, a logic "1" may be determined when no (or relatively less) charge is provided by the AMPCAP, whereas a logic "0" may be determined when some (or relatively more) charge is provided by the AMPCAP. Such a sensing scheme may allow for more reliable read operations, while utilizing a smaller amplification capacitor.

In some cases, a ferroelectric memory cell may maintain the initial logic state after a read operation. For example, if charge state 305-b is stored, the charge state may follow path 340 to charge state 305-c during a read operation and, after removing voltage 335, the charge state may return to initial charge state 305-b by following path 340 in the opposite direction. In some cases, a ferroelectric memory cell may lose its initial logic state after a read operation. For example, if charge state 310-b is stored, the charge state may follow path 345 to charge state 305-c during a read operation and, after removing voltage 335, the charge state may relax to the charge state 305-b by following path 340.

Hysteresis curve 300-b illustrates an example of reading a memory cell that is configured to store the charge state 305-b and the charge state 310-b. A read voltage 335 may be applied, for example, as a voltage difference via a digit line 215 and a plate line 220 as described with reference to FIG. 2. Hysteresis curve 300-b may illustrate read operations where the read voltage 335 is positive voltage difference Vcap (e.g., where VDL-VPL is positive). A positive read voltage across the capacitor may be referred to as a "plate low" read operation, where a digit line 215 is taken initially to a high voltage, and a plate line 220 is initially at a low voltage (e.g., a ground voltage). Although read voltage 335 is shown as a positive voltage across the ferroelectric capacitor 240, in alternative operations a read voltage may be a negative voltage across the ferroelectric capacitor 240, which may be referred to as a "plate high" read operation.

The read voltage 335 may be applied across the ferroelectric capacitor 240 when a memory cell 205 is selected (e.g., by activating a switching component 245 as described with reference to FIG. 2). Upon applying the read voltage 335 to the ferroelectric capacitor 240, charge may flow into or out of the ferroelectric capacitor 240 via the digit line 215 and plate line 220, and different charge states may result depending on whether the ferroelectric capacitor 240 was at charge state 305-b (e.g., a logic 1) or at charge state 310-b (e.g., a logic 0).

Figure 4:
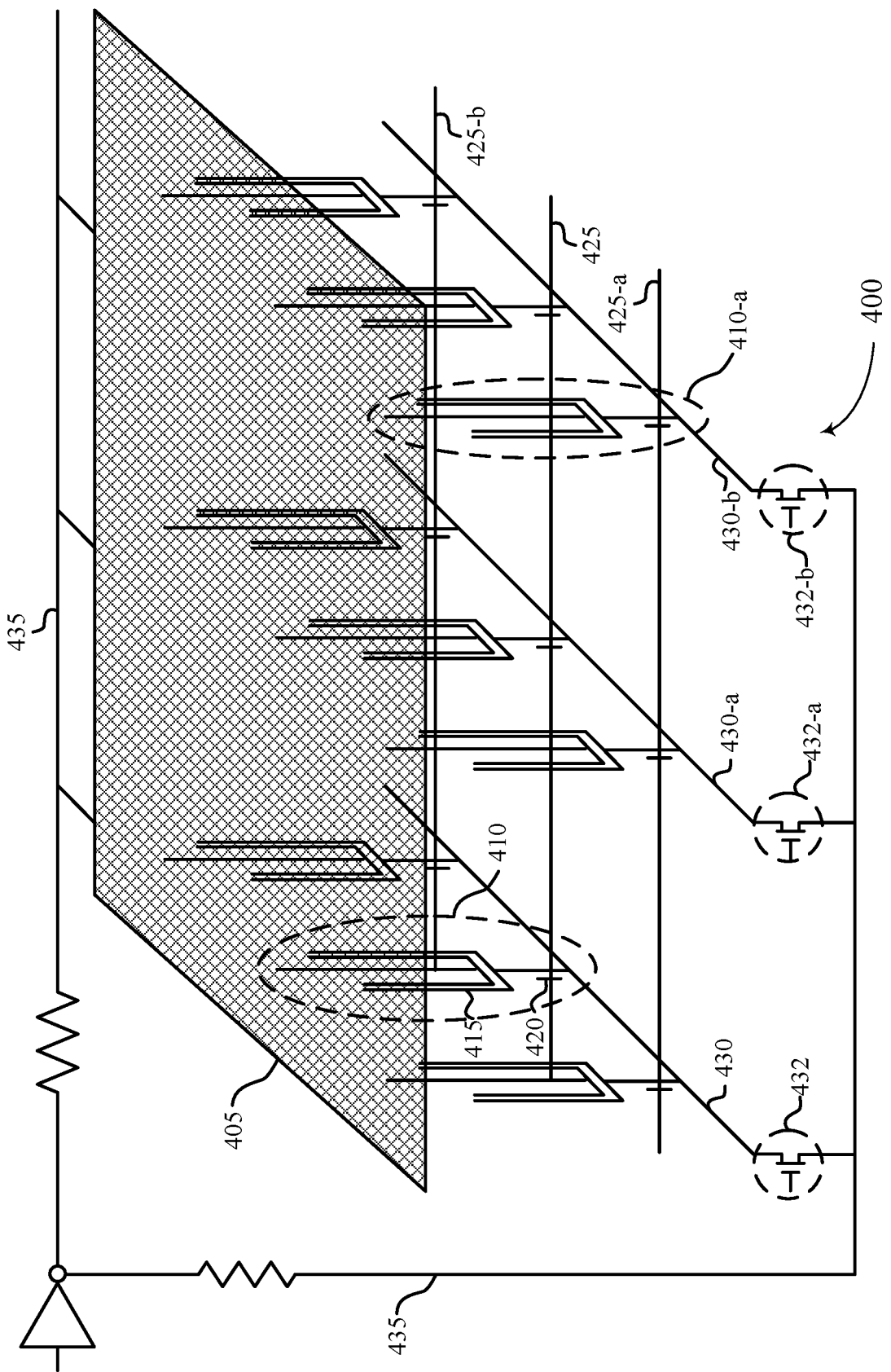
FIG. 4 illustrates an example of a memory array that includes a common plate that supports word line timing management in accordance with examples as disclosed herein.

FIG. 4 illustrates an example of a memory array 400 that includes a common plate and supports word line timing management in accordance with examples as disclosed herein. In some examples, the memory array 400 may be or may represent a portion of a larger memory array. As shown with reference to FIG. 4, the memory array may include a plate 405, a plurality of memory cells (e.g., including memory cell 410 and memory cell 410-a), a plurality of word lines (e.g., including word line 425, word line 425-a, and word line 425-b), a plurality of digit lines (e.g., including digit line 430, digit line 430-a, and digit line 430-b) and a plate line 435.

In some examples, each memory cell may include a transistor or other selector device (e.g., transistor 420 of memory cell 410) and a capacitor (e.g., capacitor 415 of memory cell 410). Each digit line (e.g., digit line 430, 430-a, 430-b) may be coupled with the plate line 435 via a respective transistor (e.g., transistor 432, transistor 432-a, transistor 432-b). Each of transistor 432, transistor 432-a, transistor 432-b may be referred to as a shunt and may be configured to couple one or more of the digit lines 430 to the plate 405. In some cases, transistors (shunts) 432 may be included in a column decoder 230 as described with reference to FIG. 1.

As described herein, a memory cell may be located at an intersection of a word line and a digit line. For example, memory cell 410 may be located at the intersection of word line 425 and digit line 430. The memory cell 410 may include a logic storage component, such as capacitor 415, and a transistor 420 (e.g., a switching or selection component). The capacitor 415 may be an example of a ferroelectric capacitor. A first node of the capacitor 415 may be coupled with the transistor 420 and a second node of the capacitor 415 may be coupled with the plate 405. To access the memory cell 410, the plate 405, the digit line 430, and the word line 425 may be selected in a certain order (e.g., by adjusting the respective voltages of the plate 405, the digit line 430, and the word line 425). In some examples, the plate 405 may be selected by applying a voltage to the plate 405 via the plate line 435.

In some examples, the plate 405 may be common to a plurality of memory cells. For example, the plate 405 may be common to at least the memory cell 410 and the memory cell 410-a. The plate 405 may be or may represent a single plate that is included in a unit (e.g., a plate group that includes a plurality of plates), and each unit may be included in a patch (e.g., a patch, which may also be referred to as a tile, or other array subsection that includes a plurality of plate groups). In some examples, the plate 405 may be located above each of the plurality of memory cells of the memory array 400. Stated another way, each memory cell of the memory array 400 may be located below the plate 405 (e.g., below the plate 405 that is common to each of the memory cells). In other examples, the plate 405 may be located below each of the plurality of memory cells of the memory array 400, and each memory cell of the memory array 400 may be located above the plate 405 (e.g., above the plate 405 that is common to each of the memory cells).

In some examples, one or more memory cells of the memory array 400 may be accessed. As discussed herein, a memory cell (e.g., memory cell 410) may be accessed by selecting the digit line 430 and the word line 425. In some examples, the digit line 430 may be selected (e.g., precharged) using a voltage supply (not shown), which in some cases may be included in a column decoder 230. After or before the digit line 430 reaches a target voltage, the word line 425 may be selected. Because the word line 425 may need to reach a target voltage (e.g., a threshold voltage of a transistor 420, which may in some cases be a TFT) in order for the capacitor 415 to be coupled with the digit line 430, it may be advantageous to select the word line 425 before decoupling the voltage supply from the digit line, to account (at least partially) for any delay in the word line reaching the target voltage or the capacitor 415 otherwise becoming coupled with the digit line 430. For example, the word line 425 may be coupled with the transistor 420, it may be advantageous to select the word line 425 while the digit line 430 is being precharged, such that the voltage of the word line 425 is equal to a threshold voltage of the transistor either while the digit line 430 is being precharged or at least with a reduced (e.g., zero) delay after the digit line 430 ceases being precharged.

During a sense operation, the digit line 430 and thus the capacitor 415 may charge share with an AMPCAP of a sense amplifier after the digit line 430 is precharged to the target voltage by the voltage supply. In some cases, the digit line 430 may be coupled with the sense amplifier at the beginning of or at some other time during or before the sense operation, but charge sharing between the AMPCAP and the capacitor 415 may not begin until the voltage supply is decoupled from the digit line 430 (e.g., decoupled from the sense amplifier)—e.g., while the voltage supply is coupled with the digit line 430, a constant (fixed) voltage may exist across the AMPCAP such that charge sharing between the AMPCAP and the capacitor 415 is precluded until the voltage supply is removed (decoupled).

In some examples, the digit line 430 may be coupled with the capacitor 415 before the voltage supply is decoupled from the digit line 430, and an amount of charge may be shared between the voltage supply and the capacitor 415. In some examples, this amount of charge may account for or otherwise reflect a change in the displacement charge of the memory cell 410, which may change more rapidly than the dipole charge. This amount of charge may additionally be referred to as a common mode between different logic states stored to the memory cell 410.

For example, when sensed, a memory cell 410 storing a first logic state (e.g., a logic "0") may share an amount of charge including a displacement charge and a dipole charge, and a memory cell 410 storing a second logic state (e.g., a logic "1") may share an amount of charge including only a displacement charge. The displacement charge common both logic states may be supplied (e.g., accounted for) by the supply voltage, while the AMPCAP may supply a charge corresponding to the dipole charge, if the memory cell 410 stores the first logic state. Accordingly, when sensing the second logic state (e.g., a logic "0") of the memory cell 410, the AMPCAP may provide no (or relatively little) charge (due to the displacement charge having been provided by the voltage supply). However, when sensing the first logic state (e.g., a logic "1") of the memory cell 410, the AMPCAP may provide an amount of charge that corresponds to at least some portion of the dipole charge (e.g., due to the voltage supply having previously suppled the displacement charge). Accordingly, the sensing scheme employed herein may determine a logic state stored by a memory cell 410 based on whether any (or a relatively larger amount of) charge (e.g., dipole charge) is shared between the AMPCAP and the capacitor 415. Thus, the time at which the word line 425 is selected may allow for more reliable sensing by eliminating a common mode (e.g., common mode amount of charge) between logic states from an amount of charge integrated by an AMPCAP, while also supporting the use of a smaller AMPCAP.

In some examples, the time at which the word line 425 is selected may be a trim parameter (trimmable) or otherwise configurable (adjustable, tunable). For example, the time at which the word line 425 is selected may be adjusted in order to better-align the end of the precharge operation and the time at which the transistor 420 becomes conductive. As another example, the time at which the time at which the word line 425 is selected may be configured based on a topology of the memory die or related bases, which may include a length of the selected digit line 430, a length of the selected world line 425, a position of the memory cell 410 in the memory array 400, a distance between the memory cell 410 and other components of the memory array 400 (e.g., the sense amplifier, the voltage supply, a word line driver), or any combination of these. For example, a word line 425 may be selected at a relatively earlier time within the timeline of an access operation when the memory cell 410 is relatively farther from the sense amplifier and/or the voltage source, and the word line 425 may be selected at a relatively later time within the timeline of an access operation when the memory cell 410 is relatively closer to the sense amplifier and/or the voltage source. As another example, a word line 425 may be selected at a relatively earlier time within the timeline of an access operation when the memory cell 410 is relatively farther from a word line driver used to activate the word line 425, and the word line 425 may be selected at a relatively later time within the timeline of an access operation when the memory cell 410 is relatively closer to the word line driver used to activate the word line 425. Within the timeline of an access operation, the time at which a word line 425 is selected may be adjusted or otherwise configured on a per word line 425 or per group (subset) of word lines 425 basis (so as to vary across word lines 425 within the memory array 400) or may be adjusted for all word lines 425 within the memory array (e.g., relative to a factory or default setting).

Figure 5:
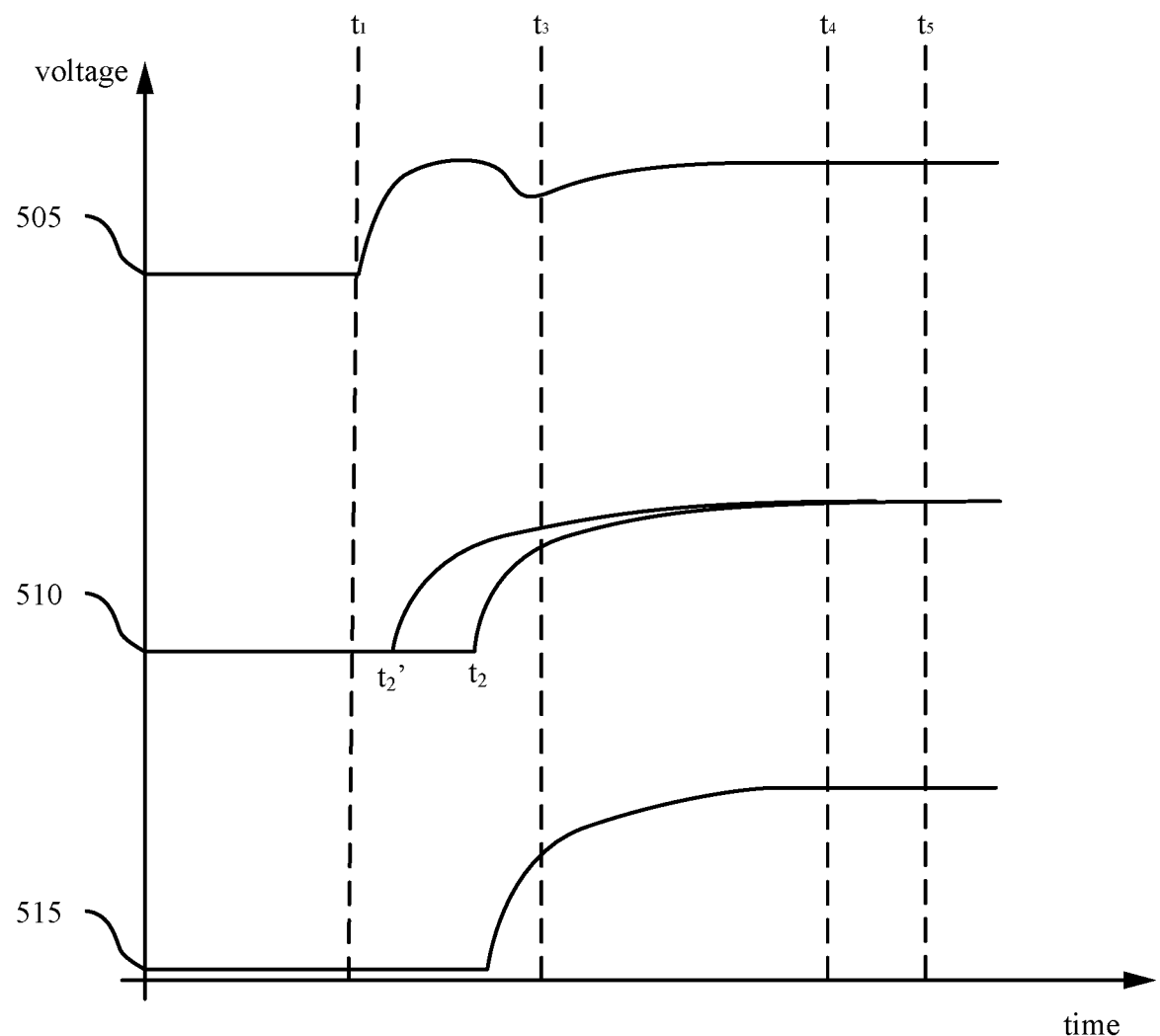
FIG. 5 illustrates an example of a timing diagram that supports word line timing management in accordance with examples as disclosed herein.

FIG. 5 illustrates an example of a timing diagram 500 that supports word line timing management in accordance with examples as disclosed herein. For example, the timing diagram 500 may illustrate a first phase (e.g., an activation phase) of an access operation for a ferroelectric memory cell. In some examples, the timing diagram 500 may include a selected digit line signal 505, a selected word line signal 510, and a sense amplifier node signal 515 during the first phase. In some examples, the selected digit line signal 505 and the selected word line signal 510 may respectively illustrate voltages of a digit line 430 and a word line 425 as described with reference to FIG. 4.

In some examples, prior to the first phase, the selected digit line 430 may be coupled with a plate, such that the selected digit line signal 505 is a same voltage as a voltage of the plate. Upon receiving one or more commands (e.g., an activate command, a read command), the selected digit line 430 may be decoupled from the plate. At $t_1$, the selected digit line 430 may be coupled with a sense amplifier.

In some examples, the one or more commands may result in the selected digit line being biased (e.g., precharged) to a first voltage (e.g., vbias) by applying a voltage (e.g., from a voltage supply, such as a voltage supply within or coupled with the sense amplifier) to the selected digit line 430 at $t_1$. The voltage supply may be configured to bias the selected digit line 430 such that the selected digit line signal 505 is equal to a target voltage (e.g., to vbias). In some examples, the selected digit line 430 may be precharged as part of an access operation configured to sense (e.g., read) a logic state of the memory cell. The memory cell may ultimately be accessed by selecting the digit line 430 and the word line 425, which may each be coupled with a transistor (e.g., a TFT) or other selection component included in the memory cell.

By applying the voltage to the selected digit line 430 beginning at $t_1$, a parasitic capacitance of the selected digit line 430 may be charged so that a charge stored in the memory cell is not disturbed when the selected digit line 430 is later coupled with a ferroelectric capacitor within the memory cell. The voltage supply may be decoupled from the selected digit line 430 at $t_3$ (and thus precharging the digit line may begin at $t_1$ and end at $t_3$), and the selected digit line signal 505 may reach the target voltage at or before $t_3$.

FIG. 5 illustrates illustrative examples of when the word line 425 may be selected (e.g., $t_2$ and $t_2'$), but it is to be understood that the word line 425 may be selected at any time either concurrent with or before $t_3$. In some cases, the time at which the word line 425 is selected may be configurable (e.g., trimmable), or may vary across different word lines 425 with a same device as described herein.

After the word line 425 is selected, the selected digit line signal 505 may temporarily decrease as a result of charge sharing between the selected digit line 430 and the ferroelectric capacitor within the memory cell. In some examples, however, the selected digit line signal 505 may increase back to the target voltage (e.g., to vbias), and thus the charge sharing between the selected digit line 430 and the ferroelectric capacitor within the memory cell may have minimal or no net impact on the determination of the logic state stored by the memory cell prior to $t_1$.

In some examples, when the word line 425 is selected at $t_2$, a voltage may be applied to the word line 425 at $t_2$ such that the selection component subsequently becomes conductive (e.g., at or before $t_3$). In some examples, the selection component may be or include a transistor (e.g., a TFT) that is coupled with the selected word line 425, and the selection component may become conductive when the selected word line signal 510 reaches the threshold voltage of the transistor.

In some examples, the time at which the word line 425 is selected may be earlier than $t_3$ by a first duration. For example, the word line 425 may be selected at $t_2$, which may occur before $t_3$, where the time between $t_2$ and $t_3$ equals the first duration. By selecting the word line 425 at $t_2$, the beginning of the selection component conduction (e.g., the transistor coupled with the memory cell becoming conductive) may be less delayed (if delayed at all) relative to the end of the precharging of the selected digit line 430. Thus, selecting the word line 425 at $t_2$ may result in a reduction of the number of clock cycles between a host device issuing an activate command and the logic state of the memory cell being determined, or the completion of an associated access operation, which may provide latency or other benefits.

During a sensing operation, a precharge of the selected digit line 430 may begin at $t_1$. As discussed herein, the selected digit line signal 505 may be increasing (e.g., toward a target voltage) or have recharged the target voltage when the word line 425 is selected (e.g., at $t_2$). At some time after the word line 425 is selected, the selection component may become conductive, and the digit line 430 may become coupled with the ferroelectric capacitor within the memory cell. For example, a voltage may be applied to the word line 425 that causes the selected word line signal 510 to equal a threshold voltage of a transistor, where the selection component is or includes the transistor. Accordingly, the selected digit line 430 may become coupled with the ferroelectric capacitor (e.g., at or before $t_3$).

In some examples, the sense amplifier may be coupled with a latch (not shown). During the sensing operation described herein, a logic state of the memory cell may be sensed based on the selected digit line 430 being coupled with the ferroelectric capacitor within the memory cell (e.g., based on the digit line 430 and the word line 425 being selected). For example, charge sharing between the AMP-CAP and the ferroelectric capacitor may end at or before $t_4$, and a logic state of the memory cell may be sensed (e.g., stored to the latch) at or near time $t_4$. In some cases, charge sharing between the AMPCAP and the ferroelectric capacitor may end at or before $t_4$. For example, the time $t_4$ may correspond to a firing event of the latch, which may include the latch being connected to (e.g., coupled with) a supply voltage. When the latch is connected to a supply voltage, the latch may develop a sensed signal on one side (e.g., a signal sensed from the memory cell, corresponding to the sense amplifier node signal 515 developed at the node of the sense amplifier) and a reference signal on the other side (e.g., the opposite side of the latch). Because the signals may be different, the latch may become unbalanced, which may indicate the logic state of the memory cell (e.g., a logic "1" or a logic "0").

Thus, when the word line 425 may be selected at $t_2$, the word line may begin conducting and the digit line 430 may be coupled with the ferroelectric capacitor within the memory cell at or before $t_3$, and the logic state of the memory cell may be sensed (e.g., latched) at or near $t_4$. In some examples, an access command (e.g., a read or write command) may be received by the memory device after $t_1$, including after $t_4$, such as at or near $t_5$. In some cases, the duration between $t_1$ and $t_5$ may be referred to as a row address to column address delay (tRCD) (e.g., the number of clock cycles taken between a host device issuing an activate command and the host device issuing a read/write command). Thus, selecting the word line at a time as described herein may in some cases reduce the tRCD duration, along with other durations (latencies) associated with accessing a memory cell.

In some cases, where $t_2$ is configurable (e.g., trimmable, adjustable), $t_2$ may be configured to account for process variations or other factors that may include the turn-on time or threshold voltage of one or more transistors 420. Thus, $t_2$ may be optimized (e.g., at a device or die level of granularity) to align or otherwise reduce the time gap between $t_3$ and when the voltage across a transistor 420 reaches the threshold voltage of the transistor 420.

In some examples, the time at which the word line 425 is selected may be earlier than $t_3$ by a second duration (e.g., a greater duration than the first duration). For example, the word line 425 may be selected at $t_2'$, which may be sufficiently before $t_3$ that the transistor with the memory cell becomes conductive (and thus the digit line 430 becomes coupled with the ferroelectric capacitor within the memory cell) before $t_3$ (as opposed to at or with reduced delay after $t_3$), and thus before the voltage supply is decoupled from the digit line 430. By selecting the word line 425 at $t_2'$, an amount of shared charge common to both logic states of a memory cell (e.g., a change in displacement charge common to sensing a logic "0" and sensing a logic "1") may be shared with (e.g., supplied to) the ferroelectric capacitor by the voltage supply. Compared to selecting the word line 425 at $t_2$, selecting the word line 425 at $t_2'$ may further reduce the tRCD duration, along with other durations (latencies) associated with accessing a memory cell.

In some examples, when the word line 425 is selected at $t_2'$, charge sharing may occur between the voltage supply (coupled with the digit line 430) and a ferroelectric capacitor of the ferroelectric memory cell. That is, a first amount of charge may be transferred between the ferroelectric capacitor and the voltage supply. The first amount of charge may include a change in displacement charge at the ferroelectric capacitor, and in some cases may also include a change in dipole charge at the ferroelectric capacitor. Additionally (e.g., beginning at $t_3$), the ferroelectric capacitor may charge share with a capacitor of the sense amplifier and a second amount of charge may be transferred between the ferroelectric capacitor and the capacitor (e.g., AMPCAP). As discussed herein, any amount (or an amount above a non-zero threshold) of charge being transferred between the AMPCAP and the ferroelectric capacitor (e.g., from the AMPCAP to the ferroelectric capacitor) may indicate a particular logic state of the memory cell. The second amount of charge may include a further change in dipole charge at the ferroelectric capacitor. In some cases, the second amount of charge may also include a further change in displacement charge at the ferroelectric capacitor, and in other cases, the second amount of charge may be exclusive of (may not include, may be independent of) any change in displacement charge at the ferroelectric capacitor.

For example, the selected digit line 430 may be coupled with the voltage supply (e.g., the voltage supply of the sense amplifier) and may charge share with the voltage supply prior to $t_3$ such that a portion of the change in charge stored at the memory cell during the sense operation is supplied by the voltage supply. In some examples, this charge may account for some or all of a change in displacement charge of the memory cell. In some examples, this charge may account for only some (e.g., a small portion of) a change in dipole charge of the memory cell. As discussed herein, a first logic state (e.g., a logic "0") may be associated with a change in charge at the memory cell that includes a change in displacement charge and a change in dipole charge, and a second logic state (e.g., a logic "1") may be associated with a change only in displacement charge.

Thus, in some cases (e.g., when the word line 425 is selected at $t_2'$), the charge sharing between the voltage supply and the memory cell may negate any (all) displacement charge that would otherwise be shared between the memory cell and the AMPCAP, but may not negate all dipole charge that would otherwise be shared between the memory cell and the AMPCAP. That is, when no (or relatively less) charge (e.g., no displacement charge or dipole charge) is transferred between the memory cell and the AMPCAP, the memory cell may be determined to store a second logic state (e.g., a logic "1"). Additionally or alternatively, when some (or relatively more) charge (e.g., a dipole charge) is transferred between the AMPCAP and the memory cell, the memory cell may be determined to store a first logic state (e.g., a logic "0"). Thus, due to the charge sharing, the displacement charge may be provided by the supply voltage, while at least a majority of the dipole charge (if the memory cell stores the first logic state) may be shared with (e.g., provided by) the AMPCAP. In some examples, dipole charge may be transferred between the memory cell and the AMPCAP after the precharging of the selected digit line 430 ends (e.g., after $t_3$).

During a sensing operation where the word line 425 is selected at $t_2'$, a precharge of the selected digit line 430 may begin at $t_1$. In some cases, the selected digit line signal 505 may be increasing (e.g., toward a target voltage) when the word line 425 is selected (e.g., at $t_2'$). After the word line 425 is selected, the voltage supply and the ferroelectric capacitor within the memory cell may begin charge sharing—and the selected digit line 430 may be coupled with the ferroelectric capacitor within the memory cell—before $t_3$. In some examples, the selected digit line signal 505 may temporarily decrease as a result of charge sharing between the selected digit line 430 and the ferroelectric capacitor within the memory cell. In the example illustrated in FIG. 5, the selected digit line signal 505 temporarily decreases after $t_2$ before increasing back to the target voltage (e.g., to vbias). In some examples, charge may be transferred between the memory cell and the AMPCAP between $t_3$ and $t_4$.

During a sensing operation as described herein, a logic state of the memory cell may be sensed based on the selected digit line 430 being coupled with the ferroelectric capacitor within the memory cell (e.g., based on the digit line 430 and the word line 425 being selected). For example, a logic state of the memory cell may be sensed (e.g., stored to the latch) at or near time $t_4$. Thus, when the word line 425 is selected at $t_2'$, the selected word line 425 may begin conducting and charge may be transferred between the memory cell and the AMPCAP between $t_3$ and $t_4$, and the logic state of the memory cell may be sensed (e.g., latched) at or near $t_4$.

As described herein, the logic state of the memory cell may be determined based on the signal developed at the node of the sense amplifier, as illustrated by the sense amplifier node signal 515. Because selecting the word line 425 at $t_2$' may result in no charge being transferred between the AMPCAP and the node of the sense amplifier when a second logic state is stored, and a charge (e.g., a dipole charge) being transferred between the AMPCAP and the node of the sense amplifier when a first logic state is stored, the sense amplifier may be able to more accurately sense the logic state of the memory cell. Such increased accuracy may be due to the ratio (e.g., an infinite ratio) between sense amplifier node signal 515 when a first logic state is stored as opposed to a second logic state.

In some cases, where $t_2$' is configurable (e.g., trimmable, adjustable), $t_2$' may vary across word lines 425 within a same memory device or die. For example, the time gap between $t_2$' and $t_3$ may be proportional to the distance between the word line 425 and the precharge voltage supply (e.g., a word line 425 that is farther from the precharge voltage supply may be selected with a larger time gap (earlier within the context of an access operation), while a word line 425 that is nearer the precharge voltage supply may be selected with a smaller time gap (later within the context of an access operation)). As another example, the time gap between $t_2$' and $t_3$ may be proportional to the distance between the word line 425 and a sense amplifier (e.g., a word line 425 that is farther from the sense amplifier may be selected with a larger time gap (earlier within the context of an access operation), while a word line 425 that is nearer the sense amplifier may be selected with a smaller time gap (later within the context of an access operation)). And as another example, the time gap between $t_2$' and $t_3$ may be proportional to the distance between the word line 425 and a word line driver used to apply the selection voltage to the word line 425 (e.g., a word line 425 that is farther from the word line driver may be selected with a larger time gap (earlier within the context of an access operation), while a word line 425 that is nearer the word line driver may be selected with a smaller time gap (later within the context of an access operation)). Thus, a memory controller may select different word lines 425 with different amounts of anticipation, and the time gap between $t_2$' and $t_3$ for an access operation performed on one row of memory cells may be different than the time gap between $t_2$' and $t_3$ for an access operation performed on a different row of memory cells. It is to be understood that $t_2$ may likewise be configurable and vary according to any basis described for $t_2$', and that $t_2$' may likewise be configurable and vary according to any basis described for $t_2$.

Figure 6:
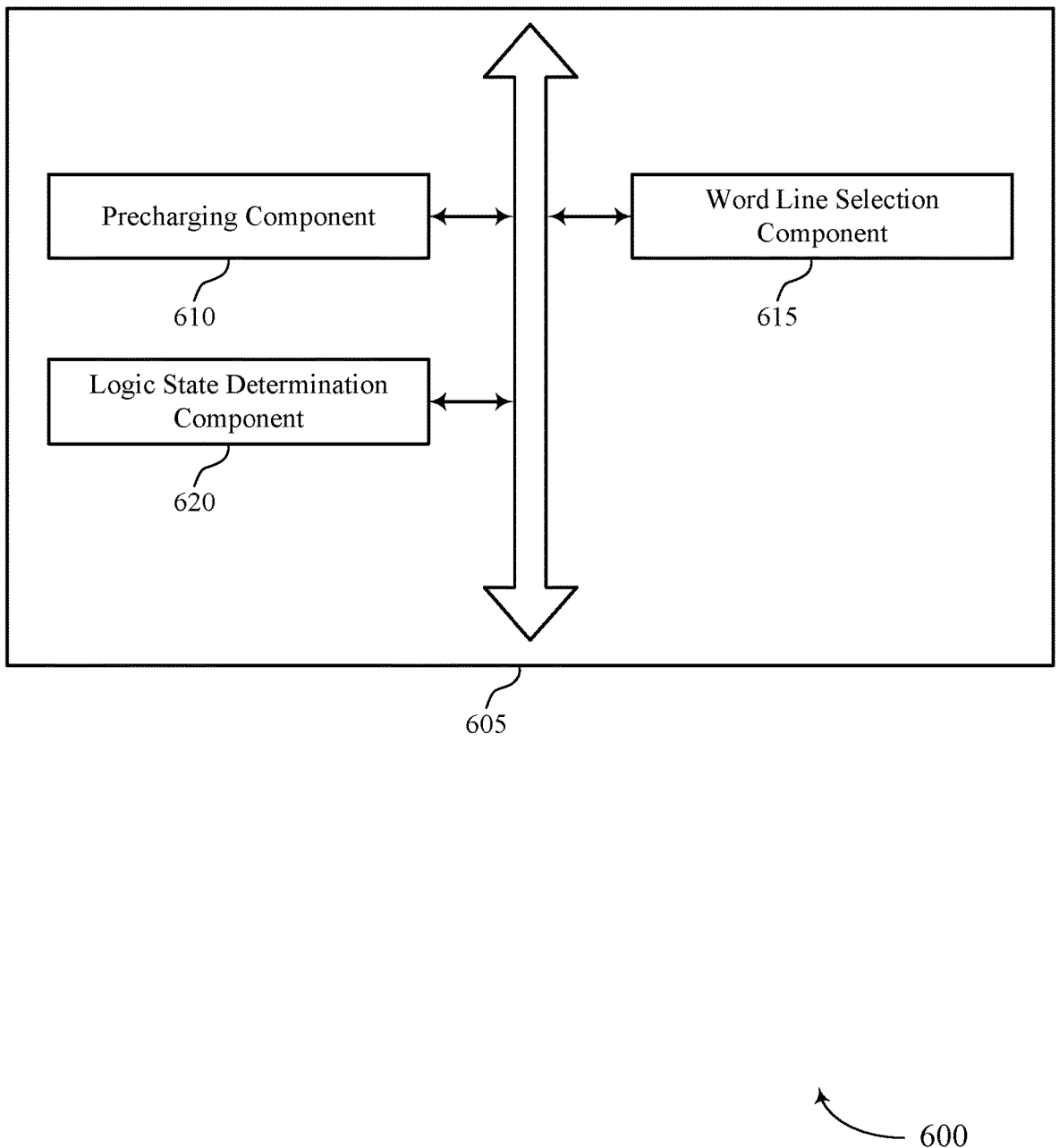
FIG. 6 shows a block diagram of a memory array that supports word line timing management in accordance with aspects of the present disclosure.

FIG. 6 shows a block diagram 600 of an access operation manager 605 that supports word line timing management in accordance with examples as disclosed herein. The access operation manager 605 may be include or be coupled with aspects of a memory array as described with reference to FIGS. 4 and 5. The access operation manager 605 may include a precharging component 610, a word line selection component 615, and a logic state determination component 620. Each of these modules may communicate, directly or indirectly, with one another (e.g., via one or more buses).

The precharging component 610 may precharge, from a first time until a third time using a voltage supply, a digit line coupled with a ferroelectric memory cell, where the ferroelectric memory cell includes a ferroelectric capacitor and is coupled with a word line. In some examples, the precharging component 610 may couple the digit line with the voltage supply at the first time. The precharging component 610 may decouple the digit line from the voltage supply at the third time.

The word line selection component 615 may select the word line, at a second time between the first time and the third time and based on precharging the digit line, to cause the ferroelectric capacitor to become coupled with the digit line. In some examples, the word line selection component 615 may determine a duration between the first time and the second time based on a configurable parameter. In some cases, a duration between the first time and second time may be based at least in part on a distance between the word line and the voltage supply, a distance between the word line and a sense component, a distance between the word line and a word line driver, or any combination thereof.

In some cases, the digit line, the word line, and the ferroelectric capacitor are coupled with a transistor. In some cases, selecting the word line comprises applying a voltage to the word line at the second time to cause a voltage of the word line to equal a threshold voltage of the transistor at or before the third time. In some cases, the transistor begins conducting, based on selecting the word line, at or before the third time. In some cases, based on selecting the word line at the second time, the ferroelectric capacitor begins charge sharing with a capacitor at the third time.

In some cases, based on selecting the word line at the second time, an amount of charge is transferred between the ferroelectric capacitor and the voltage supply before the third time. In some cases, the word line selection component 615 may couple the ferroelectric memory cell with a capacitor based on selecting the word line, where a second amount of charge is transferred between the ferroelectric memory cell and the capacitor based on the coupling. In some cases, the second amount of charge is transferred between the ferroelectric memory cell and the capacitor after the third time. In some cases, the amount of charge is based on a displacement charge stored by the ferroelectric memory cell before the first time and is based on a polarization of the ferroelectric capacitor before the first time. In some cases, the second amount of charge is based on the polarization of the ferroelectric memory cell before the first time. In some cases, the second amount of charge is independent of the displacement charge stored by the ferroelectric memory cell before the first time.

The logic state determination component 620 may determine a logic state stored by the ferroelectric memory cell based at least in part an amount of charge transferred between the ferroelectric capacitor and a capacitor, where the capacitor begins charge sharing with the ferroelectric capacitor at the third time.

Figure 7:
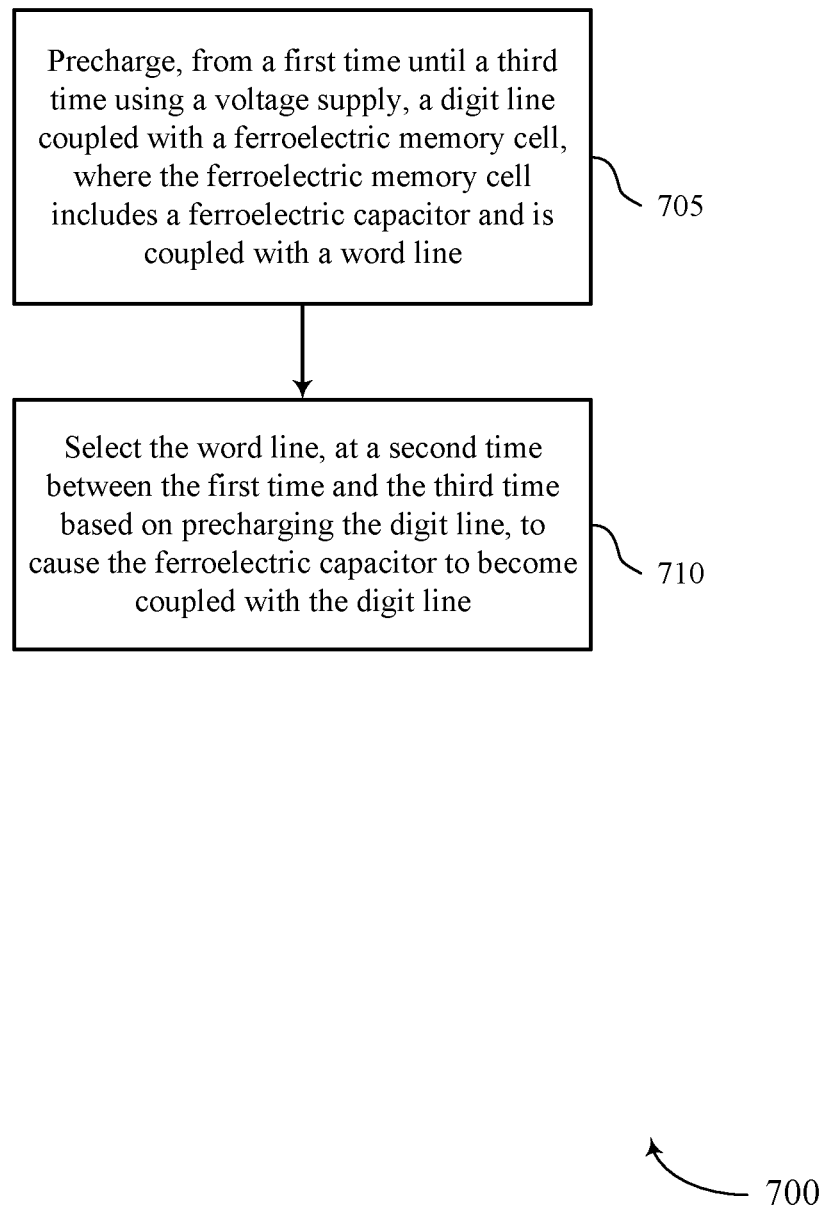
FIGS. 7 through 9 show flowcharts illustrating a method or methods that support word line timing management in accordance with examples as disclosed herein.

FIG. 7 shows a flowchart illustrating a method or methods 700 that supports word line timing management in accordance with aspects of the present disclosure. The operations of method 700 may be implemented by a memory controller or its components as described herein. For example, the operations of method 700 may be performed by an access operation manager as described with reference to FIG. 6. In some examples, a memory controller may execute a set of instructions to control the functional elements of the memory controller to perform the described functions. Additionally or alternatively, a memory controller may perform aspects of the described functions using special-purpose hardware.

At 705, a digit line coupled with a ferroelectric memory cell may be precharged, from a first time until a third time, using a voltage supply, where the ferroelectric memory cell includes a ferroelectric capacitor and is coupled with a word line. The operations of 705 may be performed according to the methods described herein. In some examples, aspects of the operations of 705 may be performed by a precharging component as described with reference to FIG. 6.

At 710, the word line may be selected, at a second time between the first time and the third time and based on precharging the digit line, to cause the ferroelectric capacitor to become coupled with the digit line. The operations of 710 may be performed according to the methods described herein. In some examples, aspects of the operations of 710 may be performed by a word line selection component as described with reference to FIG. 6.

In some examples, an apparatus as described herein may perform a method or methods, such as the method 700. The apparatus may include features, means, or instructions (e.g., a non-transitory computer-readable medium storing instructions executable by a processor) for precharging, from a first time until a third time using a voltage supply, a digit line coupled with a ferroelectric memory cell, where the ferroelectric memory cell includes a ferroelectric capacitor and is coupled with a word line, along with features, means, or instructions for selecting the word line, at a second time between the first time and the third time and based on precharging the digit line, to cause the ferroelectric capacitor to become coupled with the digit line.

In some examples of the method 700 and the apparatus described herein, the digit line, the word line, and the ferroelectric capacitor may be coupled with a transistor, and selecting the word line may include operations, features, means, or instructions for applying a voltage to the word line at the second time to cause a voltage of the word line to equal a threshold voltage of the transistor at or before the third time.

In some examples of the method 700 and the apparatus described herein, the digit line, the word line, and the ferroelectric capacitor may be coupled with a transistor, and the transistor may begin conducting, based on selecting the word line, at or before the third time.

In some examples of the method 700 and the apparatus described herein, based on selecting the word line at the second time, the ferroelectric capacitor may begin charge sharing with a capacitor at the third time.

In some examples of the method 700 and the apparatus described herein, based on selecting the word line at the second time, an amount of charge may be transferred between the ferroelectric capacitor and the voltage supply before the third time.

Some examples of the method 700 and the apparatus described herein may further include operations, features, means, or instructions for coupling the ferroelectric memory cell with a capacitor based on selecting the word line, where a second amount of charge may be transferred between the ferroelectric memory cell and the capacitor based on the coupling. In some examples of the method 700 and the apparatus described herein, the second amount of charge may be transferred between the ferroelectric memory cell and the capacitor after the third time. In some examples of the method 700 and the apparatus described herein, the amount of charge may be based on a displacement charge exchanged between the voltage supply and the ferroelectric memory cell before the third time and may be based on a polarization of the ferroelectric capacitor before the first time, and the second amount of charge may be based on the polarization of the ferroelectric memory cell before the first time. In some examples of the method 700 and the apparatus described herein, the second amount of charge may be independent of the displacement charge exchanged between the voltage supply and the ferroelectric memory cell before the third time.

Some examples of the method 700 and the apparatus described herein may further include operations, features, means, or instructions for determining a logic state stored by the ferroelectric memory cell based at least in part an amount of charge transferred between the ferroelectric capacitor and a capacitor, where the capacitor begins charge sharing with the ferroelectric capacitor at the third time.

In some examples of the method 700 and the apparatus described herein, precharging the digit line from the first time until the third time may include coupling the digit line with the voltage supply at the first time, and decoupling the digit line from the voltage supply at the third time.

Some examples of the method 700 and the apparatus described herein may further include operations, features, means, or instructions for determining a duration between the first time and the second time based on a configurable parameter.

In some examples of the method 700 and the apparatus described herein, a duration between the first time and second time may be based on a distance between the word line and the voltage supply, a distance between the word line and a sense component, a distance between the word line and a word line driver, or any combination thereof.

Figure 8:
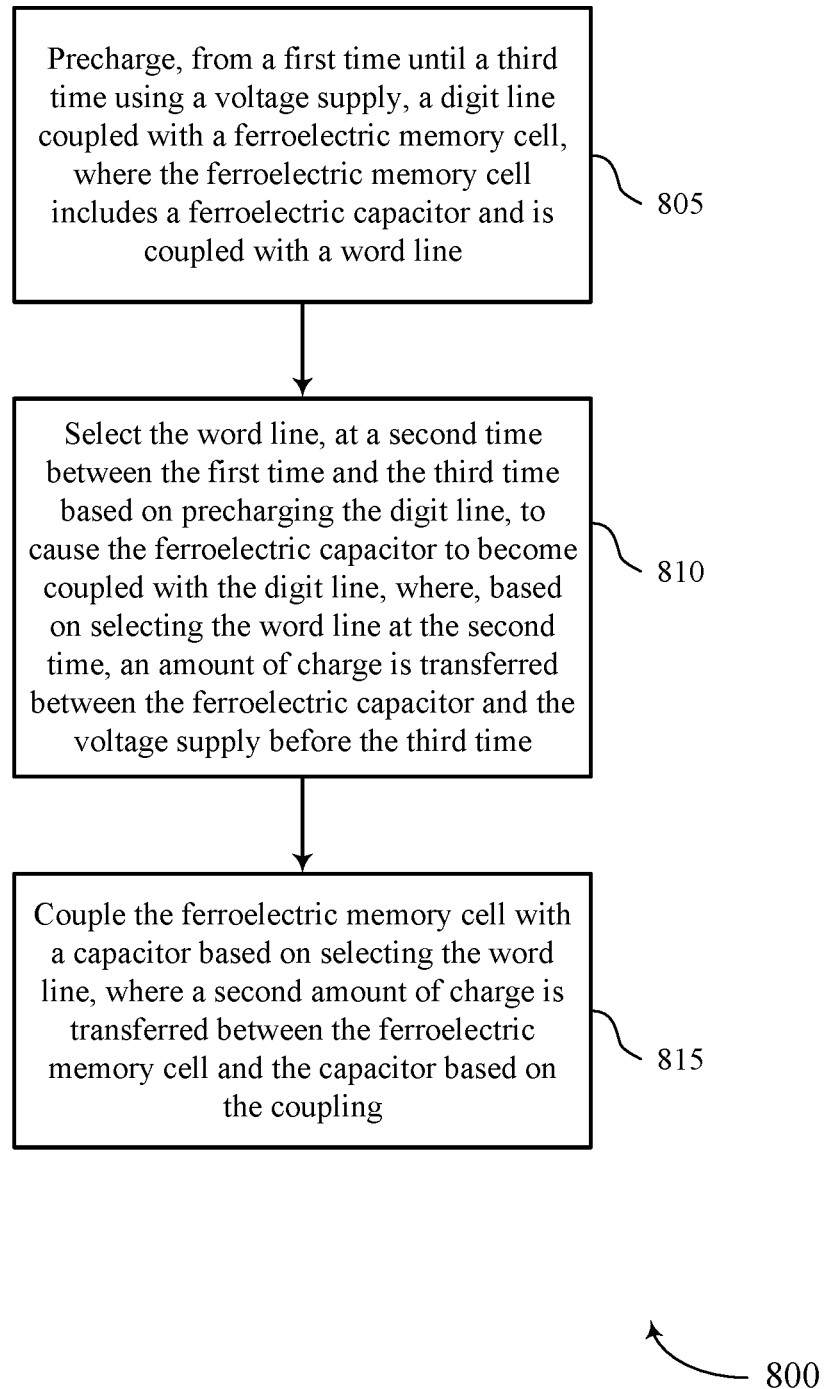

FIG. 8 shows a flowchart illustrating a method or methods 800 that supports word line timing management in accordance with aspects of the present disclosure. The operations of method 800 may be implemented by a memory controller or its components as described herein. For example, the operations of method 800 may be performed by an access operation manager as described with reference to FIG. 6. In some examples, a memory controller may execute a set of instructions to control the functional elements of the memory controller to perform the described functions. Additionally or alternatively, a memory controller may perform aspects of the described functions using special-purpose hardware.

At 805, a digit line coupled with a ferroelectric memory cell may be precharged, from a first time until a third time, using a voltage supply, where the ferroelectric memory cell includes a ferroelectric capacitor and is coupled with a word line. The operations of 805 may be performed according to the methods described herein. In some examples, aspects of the operations of 805 may be performed by a precharging component as described with reference to FIG. 6.

At 810, the word line may be selected, at a second time between the first time and the third time and based on precharging the digit line, to cause the ferroelectric capacitor to become coupled with the digit line, where, based on selecting the word line at the second time, an amount of charge is transferred between the ferroelectric capacitor and the voltage supply before the third time. The operations of 810 may be performed according to the methods described herein. In some examples, aspects of the operations of 810 may be performed by a word line selection component as described with reference to FIG. 6.

At 815, the ferroelectric memory cell may be coupled with a capacitor based on selecting the word line, where a second amount of charge is transferred between the ferroelectric memory cell and the capacitor based on the coupling. The operations of 815 may be performed according to the methods described herein. In some examples, aspects of the operations of 815 may be performed by a word line selection component as described with reference to FIG. 6.

Figure 9:
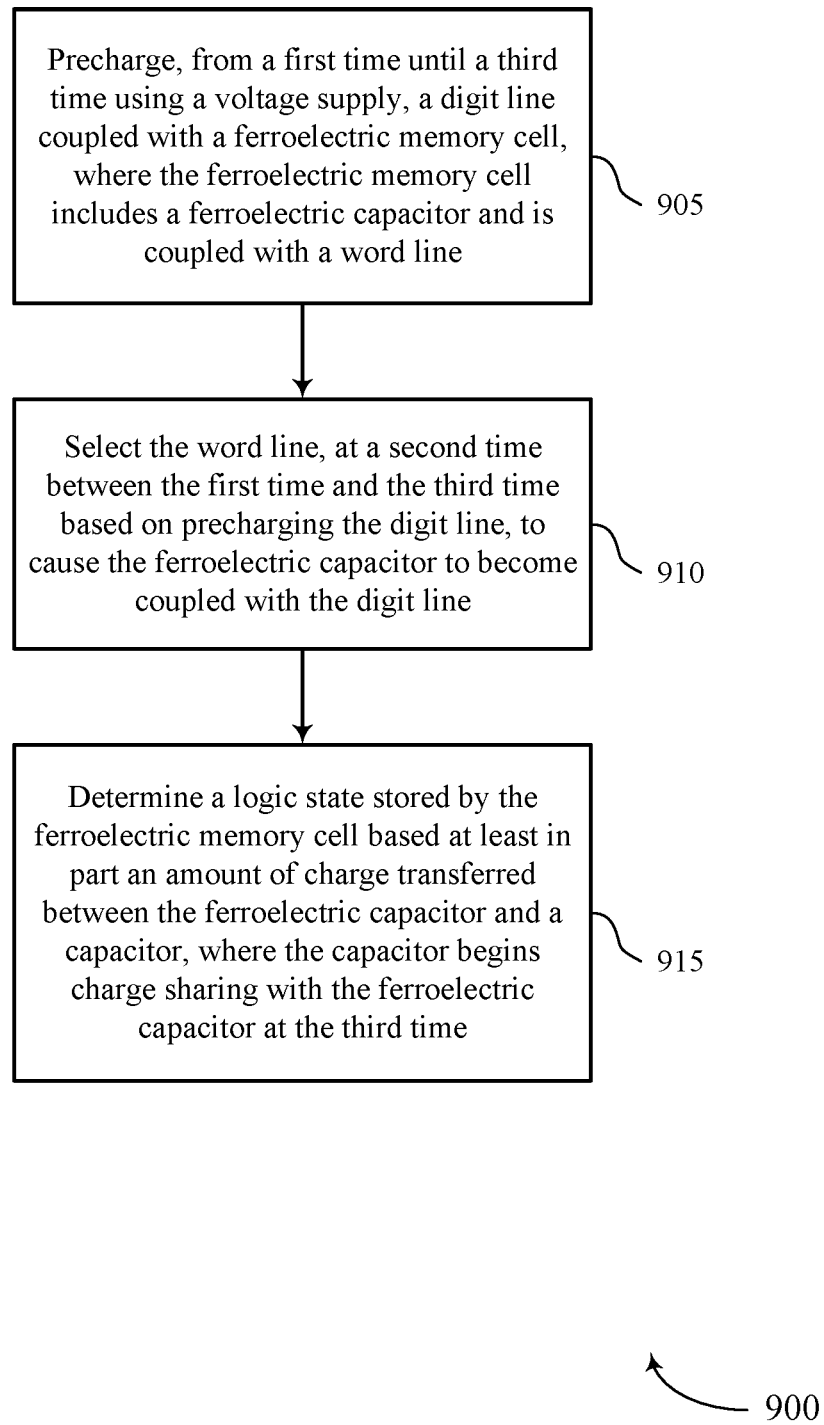

FIG. 9 shows a flowchart illustrating a method or methods 900 that supports word line timing management in accordance with aspects of the present disclosure. The operations of method 900 may be implemented by a memory controller or its components as described herein. For example, the operations of method 900 may be performed by an access operation manager as described with reference to FIG. 6. In some examples, a memory controller may execute a set of instructions to control the functional elements of the memory controller to perform the described functions. Additionally or alternatively, a memory controller may perform aspects of the described functions using special-purpose hardware.

At 905, a digit line coupled with a ferroelectric memory cell may be precharged, from a first time until a third time, using a voltage supply, where the ferroelectric memory cell includes a ferroelectric capacitor and is coupled with a word line. The operations of 905 may be performed according to the methods described herein. In some examples, aspects of the operations of 905 may be performed by a precharging component as described with reference to FIG. 6.

At 910, the word line may be selected, at a second time between the first time and the third time and based on precharging the digit line, to cause the ferroelectric capacitor to become coupled with the digit line. The operations of 910 may be performed according to the methods described herein. In some examples, aspects of the operations of 910 may be performed by a word line selection component as described with reference to FIG. 6.

At 915, a logic state stored by the ferroelectric memory cell may be determined based at least in part an amount of charge transferred between the ferroelectric capacitor and a capacitor, where the capacitor begins charge sharing with the ferroelectric capacitor at the third time. The operations of 915 may be performed according to the methods described herein. In some examples, aspects of the operations of 915 may be performed by a logic state determination component as described with reference to FIG. 6.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a ferroelectric memory cell that includes a ferroelectric capacitor and a selector component, a digit line coupled with the ferroelectric memory cell, a voltage supply configured to be coupled with the digit line at a first time and to be decoupled from the digit line at a third time, and a word line coupled with the selector component and configured to be selected at a second time that is before the third time, where the selector device is configured to couple the ferroelectric capacitor with the digit line based on the word line being selected.

Some examples of the apparatus may include a memory controller configured to select the word line at the second time, and a driver configured to be coupled with the word line based on the word line being selected and to cause a voltage of the word line to cross a threshold voltage of the selector component at or before the third time.

In some examples, the selector component may be configured to begin conducting at or before the third time based on the word line being selected at the second time.

Some examples of the apparatus may include a capacitor configured to charge share with the ferroelectric capacitor at the third time based on the word line being selected at the second time. In some examples, a time delay between the first time and the second time may be based on a distance between the word line and the capacitor.

In some examples, the voltage supply may be configured to exchange an amount of charge with the ferroelectric capacitor before the third time based on the word line being selected at the second time. Some examples of the apparatus may include a capacitor configured to exchange a second amount of charge with the ferroelectric capacitor after the third time. In some examples, the amount of charge may be based on a displacement charge exchanged between the voltage supply and the ferroelectric capacitor before the third time, the amount of charge may also be based on a polarization of the ferroelectric capacitor before the first time, and the second amount of charge may be based on the polarization of the ferroelectric capacitor before the first time. In some examples, the second amount of charge may be independent of the displacement charge exchanged between the voltage supply and the ferroelectric capacitor before the third time.

In some examples, the ferroelectric memory cell may be coupled with a plate that may be common to a set of ferroelectric memory cells.

An apparatus is described. The apparatus may include a ferroelectric memory cell including a ferroelectric capacitor, a digit line coupled with the ferroelectric memory cell, a word line coupled with the ferroelectric memory cell, a voltage supply coupled with the digit line, and a memory controller coupled with the ferroelectric memory cell, the digit line, the word line, and the voltage supply. The memory controller may be configured to cause the apparatus to, initiate, at a first time, precharging the digit line using the voltage supply, to select the word line, based on initiating precharging the digit line, at a second time after the first time, where selecting the word line at the second time couples the ferroelectric capacitor with the digit line at or before a third time after the second time, and to discontinue, at the third time, precharging the digit line.

In some examples, the voltage supply and the ferroelectric capacitor may be configured to charge share, based on the word line being selected at the second time, before the third time.

Some examples of the apparatus may include a capacitor configure to integrate charge shared with the ferroelectric capacitor after the third time.

In some examples, the controller may be further configured to cause the apparatus to determine that a voltage of the digit line may have reached a target voltage, and to select the word line at the second time based on determining that the voltage of the digit line may have reached the target voltage at or before the second time.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
coupling, before a precharging operation, a digit line with a plate to set both the digit line and the plate to a first voltage;
precharging, from a first time until a third time using a voltage supply and after decoupling the digit line from the plate, the digit line to increase a voltage of the digit line from the first voltage to a second voltage, the digit line coupled with a ferroelectric memory cell, wherein the ferroelectric memory cell comprises a ferroelectric capacitor and is coupled with a word line; and
selecting the word line, at a second time after the first time and before the third time and based at least in part on precharging the digit line, to cause the ferroelectric capacitor to become coupled with the digit line.

2. The method of claim 1, wherein:
the digit line, the word line, and the ferroelectric capacitor are coupled with a transistor; and
selecting the word line comprises applying a voltage to the word line at the second time to cause a voltage of the word line to equal a threshold voltage of the transistor at or before the third time.

3. The method of claim 1, wherein:
the digit line, the word line, and the ferroelectric capacitor are coupled with a transistor; and
the transistor begins conducting, based at least in part on selecting the word line, at or before the third time.

4. The method of claim 1, wherein, based at least in part on selecting the word line at the second time, the ferroelectric capacitor begins charge sharing with a capacitor at the third time.

5. The method of claim 1, wherein, based at least in part on selecting the word line at the second time, an amount of charge is transferred between the ferroelectric capacitor and the voltage supply before the third time.

6. The method of claim 5, further comprising:
coupling the ferroelectric memory cell with a capacitor based at least in part on selecting the word line, wherein a second amount of charge is transferred between the ferroelectric memory cell and the capacitor based at least in part on the coupling.

7. The method of claim 6, wherein the second amount of charge is transferred between the ferroelectric memory cell and the capacitor after the third time.

8. A method, comprising:
precharging, from a first time until a third time using a voltage supply, a digit line coupled with a ferroelectric memory cell, wherein the ferroelectric memory cell comprises a ferroelectric capacitor and is coupled with a word line;
selecting the word line, at a second time after the first time and before the third time and based at least in part on precharging the digit line, to cause the ferroelectric capacitor to become coupled with the digit line, wherein, based at least in part on selecting the word line at the second time, an amount of charge is transferred between the ferroelectric capacitor and the voltage supply before the third time, and wherein the amount of charge is based at least in part on a displacement charge exchanged between the voltage supply and the ferroelectric memory cell before the third time and is based at least in part on a polarization of the ferroelectric capacitor before the first time; and
coupling the ferroelectric memory cell with a capacitor based at least in part on selecting the word line, wherein a second amount of charge is transferred between the ferroelectric memory cell and the capacitor based at least in part on the coupling, and wherein the second amount of charge is based at least in part on the polarization of the ferroelectric memory cell before the first time.

9. The method of claim 8, wherein the second amount of charge is independent of the displacement charge exchanged between the voltage supply and the ferroelectric memory cell before the third time.

10. The method of claim 1, further comprising:
determining a logic state stored by the ferroelectric memory cell based at least in part on an amount of charge transferred between the ferroelectric capacitor and a capacitor, wherein the capacitor begins charge sharing with the ferroelectric capacitor at the third time.

11. The method of claim 1, wherein precharging the digit line from the first time until the third time comprises:
coupling the digit line with the voltage supply at the first time; and
decoupling the digit line from the voltage supply at the third time.

12. The method of claim 1, further comprising:
determining a duration between the first time and the second time based at least in part on a configurable parameter.

13. The method of claim 1, wherein a duration between the first time and the second time is based at least in part on a distance between the word line and the voltage supply, a distance between the word line and a sense component, or a distance between the word line and a word line driver.

14. An apparatus, comprising:
a ferroelectric memory cell comprising a ferroelectric capacitor and a selector component;
a digit line coupled with the ferroelectric memory cell;
a plate configured to be coupled with the digit line and have a first voltage at a time prior to a precharging operation;
a voltage supply configured to be coupled with the digit line at a first time to increase a voltage of the digit line from the first voltage to a second voltage as part of the precharging operation and after the digit line is decoupled from the plate, wherein the voltage supply is further configured to be decoupled from the digit line at a third time; and
a word line coupled with the selector component and configured to be selected at a second time that is after the first time and before the third time, wherein the selector component is configured to couple the ferroelectric capacitor with the digit line based at least in part on the word line being selected.

15. The apparatus of claim 14, further comprising:
a memory controller configured to select the word line at the second time; and
a driver configured to be coupled with the word line based at least in part on the word line being selected and to cause a voltage of the word line to cross a threshold voltage of the selector component at or before the third time.

16. The apparatus of claim 14, wherein the selector component is configured to begin conducting at or before the third time based at least in part on the word line being selected at the second time.

17. The apparatus of claim 14, further comprising:
a capacitor configured to charge share with the ferroelectric capacitor at the third time based at least in part on the word line being selected at the second time.

18. The apparatus of claim 17, wherein a time delay between the first time and the second time is based at least in part on a distance between the word line and the capacitor.

19. The apparatus of claim 14, wherein the voltage supply is configured to exchange an amount of charge with the ferroelectric capacitor before the third time based at least in part on the word line being selected at the second time.

20. An apparatus, comprising:
a ferroelectric memory cell comprising a ferroelectric capacitor and a selector component;
a digit line coupled with the ferroelectric memory cell;
a voltage supply configured to be coupled with the digit line at a first time and to be decoupled from the digit line at a third time;
a word line coupled with the selector component and configured to be selected at a second time that is after the first time and before the third time, wherein the selector component is configured to couple the ferroelectric capacitor with the digit line based at least in part on the word line being selected and wherein the voltage supply is configured to exchange a first amount of charge with the ferroelectric capacitor before the third time based at least in part on the word line being selected at the second time; and
a capacitor configured to exchange a second amount of charge with the ferroelectric capacitor after the third time, wherein:
the first amount of charge is based at least in part on a displacement charge exchanged between the voltage supply and the ferroelectric capacitor before the third time and is based at least in part on a polarization of the ferroelectric capacitor before the first time; and
the second amount of charge is based at least in part on the polarization of the ferroelectric capacitor before the first time.

21. The apparatus of claim 20, wherein the second amount of charge is independent of the displacement charge exchanged between the voltage supply and the ferroelectric capacitor before the third time.

22. The apparatus of claim 14, wherein the plate is common to a plurality of ferroelectric memory cells.

23. An apparatus, comprising:
a ferroelectric memory cell comprising a ferroelectric capacitor,
a plate coupled with the ferroelectric memory cell,
a digit line coupled with the ferroelectric memory cell,
a word line coupled with the ferroelectric memory cell,
a voltage supply coupled with the digit line, and
a memory controller coupled with the ferroelectric memory cell, the digit line, the word line, and the voltage supply, wherein the memory controller is configured to cause the apparatus to:
couple the digit line with the plate before a precharging operation to set both the plate and the digit line to a first voltage;
initiate, at a first time after decoupling the digit line from the plate, precharging the digit line using the voltage supply to increase a voltage of the digit line from the first voltage to a second voltage;
select the word line, based at least in part on initiating precharging the digit line, at a second time after the first time, wherein selecting the word line at the second time couples the ferroelectric capacitor with the digit line at or before a third time that is after the second time; and
discontinue, at the third time, precharging the digit line.

24. The apparatus of claim 23, wherein the voltage supply and the ferroelectric capacitor are configured to charge share, based at least in part on the word line being selected at the second time, before the third time, further comprising:
a capacitor configured to integrate charge shared with the ferroelectric capacitor after the third time.

25. The apparatus of claim 23, wherein the memory controller is further configured to cause the apparatus to:
determine that the voltage of the digit line has reached a target voltage; and
select the word line at the second time based at least in part on determining that the voltage of the digit line has reached the target voltage at or before the second time.

* * * * *